(12) United States Patent
Katoh

(10) Patent No.: US 6,555,907 B2
(45) Date of Patent: Apr. 29, 2003

(54) HIGH-FREQUENCY INTEGRATED CIRCUIT AND HIGH-FREQUENCY CIRCUIT DEVICE USING THE SAME

(75) Inventor: Takayuki Katoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 89 days.

(21) Appl. No.: 09/906,049

(22) Filed: Jul. 17, 2001

(65) Prior Publication Data

US 2002/0109223 A1 Aug. 15, 2002

(30) Foreign Application Priority Data

Feb. 9, 2001 (JP) .......................... 2001-034342

(51) Int. Cl.[7] .......................... H01L 23/34; H01L 23/48; H01L 23/52; H01L 29/40
(52) U.S. Cl. .......................... 257/728; 257/786
(58) Field of Search .................. 257/728, 786

(56) References Cited

U.S. PATENT DOCUMENTS

| 4,926,234 A | 5/1990 | Katoh |
| 6,031,258 A | * 5/2000 | Ranjan et al. ............ 257/203 |

FOREIGN PATENT DOCUMENTS

| JP | 7-3827 B | 12/1987 |
| JP | 5-28903 B | 2/1988 |
| JP | 9-148540 A | 6/1997 |

* cited by examiner

*Primary Examiner*—David E. Graybill
(74) *Attorney, Agent, or Firm*—Leydig, Voit & Mayer, Ltd.

(57) ABSTRACT

An RF signal input terminal having an RF signal input pad connected to a switching element and grounding pads adjacent to the RF signal input pad, and RF signal output terminals, so that the directions of arrangements of signal pads and grounding pads adjacent thereto extend parallel to the direction of an arrangement of the RF signal input pad and grounding pads of the RF signal input terminal. The signal pads are connected to the switching element, and are disposed on a semiconductor substrate provided with the switching element.

14 Claims, 24 Drawing Sheets

HIGH-FREQUENCY INTEGRATED CIRCUIT AND HIGH-FREQUENCY CIRCUIT DEVICE USING THE SAME

BACKGROUND OF THE INVENTION

1. Field of the Invention

The present invention relates to a high-frequency integrated circuit operated in a high-frequency band, particularly, a millimeter-wave region of 30 GHz or more, and a high-frequency circuit device using the same.

2. Background Art

FIG. 25 is a plan view showing a conventional SP3T (Single Pole 3 Throw) switch MMIC (Monolithic Microwave IC) chip.

In FIG. 25, reference numeral 300 indicates an SP3T switch MMIC chip, reference numeral 302 indicates a GaAs substrate, and reference numeral 304 indicates a switching element, which are respectively typically illustrated. Reference numerals 306 indicate grounding pads, and reference numeral 308 indicates an RF input pad. An RF input terminal 310 comprises the RF input pad 308 and the grounding pads 306 provided on both sides thereof.

Reference numerals 312a, 312b and 312c respectively indicate RF output pads. An RF output terminal 314 comprises the RF output pad 312a and the grounding pads 306 provided on both sides thereof, an RF output terminal 316 comprises the RF output pad 312b and the grounding pads 306 provided on both sides thereof, and an RF output terminal 318 comprises the RF output pad 312c and the grounding pads 306 provided on both sides thereof, respectively. Reference numerals 320 indicate wiring layers.

FIG. 26 is a typical view showing the state of measurement of an S parameter indicative of a pass characteristic between the RF input terminal 310 and the RF output terminal 314 of the SP3T switch MMIC chip 300 (hereinafter called a-path).

In FIG. 26, reference numerals 322 indicate probe heads each having a G-S-G (Ground-Signal-Ground) structure, and reference numerals 324 indicate probes.

Of the probes 324 provided at the tip of each probe head 322, the probe for a signal terminal is placed in the center thereof, and grounding probes are disposed on both sides thereof with the probe interposed therebetween. Pads having G-S-G (Ground-Signal-Ground) structures for the RF input terminal 310 and RF output terminals 314, 316 and 318 of the MMIC chip 300 are formed with pitches matched with the probes 324.

As shown in FIG. 26, the two probe heads 322 are used to measure the S parameter indicative of the pass characteristic between the RF input terminal 310 and the RF output terminal 314 and disposed so as to be opposed to each other. The RF input terminal 310 and the RF output terminal 314 are brought into contact with their corresponding probes 324 to measure the S parameter.

FIG. 27 is a typical view showing the state of measurement of an S parameter indicative of a pass characteristic between the RF input terminal 310 and the RF output terminal 316 of the SP3T switch MMIC chip 300 (hereinafter called b-path). Further, FIG. 28 is a typical view showing the state of measurement of an S parameter indicative of a pass characteristic between the RF input terminal 310 and the RF output terminal 318 (hereinafter called c-path) of the MMIC chip 300.

In FIGS. 27 and 28, the probe heads 322 brought into contact with the RF input terminal 310 remain unchanged in position/direction. However, the probe heads 322 brought into contact with the RF output terminals 316 and 318 change not only in position but in direction as compared with the probe head 322 brought into contact with the RF output terminal 314.

When S parameters indicative of pass characteristics of an SP3T switch are measured, it is normally necessary to measure all S parameters for the a-path, b-path and c-path. In regard to each individual measurements, the probe heads 322 respectively brought into contact with the RF input terminals 310 are all identical in position and orientation, whereas the probe heads 322 respectively brought into contact with the RF output terminals 314, 316 and 318 are all different from one another in position and orientation.

Namely, the probe head 322 is placed in a left position in a rightward direction in FIG. 26 upon the a-path measurement. The probe head 322 is placed in an upper position in a downward direction in FIG. 27 upon the b-path measurement. The probe head 322 is placed in a lower position in an upward direction in FIG. 28 upon the c-path measurement.

Therefore, the respective path measurements need to re-construct and correct a measurement system. The following problems arise.

(1) A probe head for a W band is extremely expensive (about million yen/piece) and apt to wear. The number of contacts indicative of its lifetime ranges from one hundred thousand to one million. Wastage corresponding to 1 to 10 yen per contact occurs. Corrections are required each time the respective paths are changed, and at least six contacts are required upon the respective corrections. Therefore, the probe head rapidly wears when the orientation of the probe head is repeatedly changed.

(2) Since a measuring instrument and a calibration measurement standard respectively have a generally left-to-right measuring structure, they are complex in connection and reduced in measuring accuracy in the case of bend paths, i.e., b-path and c-path.

(3) The change of the orientation of each probe head is made according to manipulator's changes on a prober. Since, however, difficult manual work is accompanied by this change work, undesired situations such as a frequent drop of the probe head and a contact between each probe at the tip of the probe head and another member are apt to occur, thus causing damage to the expensive probe head frequently.

SUMMARY OF THE INVENTION

The present invention has been made with a view toward solving the above-described problems. A first object of the present invention is to provide a high-frequency integrated circuit capable of carrying out a high-frequency characteristic evaluation easily, highly accurately, in a short time and at low cost. A second object of the present invention is to provide an inexpensive and high-reliable high-frequency circuit device using such a high-frequency integrated circuit.

While Japanese Patent Laid-Open No. 9-14850 describes a pad layout which enables testing to be facilitated, it relates to the efficient arrangement of pads, which is suitable for a lead-on-chip structure. This disclosure does not describe that signal input/output ports each configured with a signal pad and grounding pads as one set are disposed such that the directions of arrangements of the signal pad and grounding pads extend parallel to one another.

According to one aspect of the present invention, a high-frequency integrated circuit comprises a semiconductor substrate, a first circuit element disposed on the semiconductor substrate and having a plurality of signal terminals, a first connecting port disposed on the semiconductor substrate and having a first signal pad connected to the first circuit element and grounding pads adjacent to the first signal pad, a second connecting port disposed on the semiconductor substrate and having a second signal pad connected to the first circuit element and grounding pads adjacent to the second signal pad in parallel with the direction of an arrangement of the first signal pad and the grounding pads of the first connecting port, and a third connecting port disposed on the semiconductor substrate and having a third signal pad connected to the first circuit element and grounding pads adjacent to the third signal pad in parallel with the direction of the arrangement of the first signal pad and the grounding pads of the first connecting port.

According to another aspect of the present invention, a high-frequency circuit device comprises a conductive mounting substrate, dielectric substrates disposed on the conductive mounting substrate and having surfaces on which signal lines are disposed, a high-frequency integrated circuit disposed on the conductive mounting substrate and comprising a semiconductor substrate, a first circuit element disposed on the semiconductor substrate and having a plurality of signal terminals, a first connecting port disposed on the semiconductor substrate and having a first signal pad connected to the first circuit element and grounding pads adjacent to the first signal pad, a second connecting port disposed on the semiconductor substrate and having a second signal pad connected to the first circuit element and grounding pads adjacent to the second signal pad in parallel with the direction of an arrangement of the first signal pad and the grounding pads of the first connecting port, a third connecting port disposed on the semiconductor substrate and having a third signal pad connected to the first circuit element and grounding pads adjacent to the third signal pad in parallel with the direction of the arrangement of the first signal pad and the grounding pads of the first connecting port, and connecting conductors for respectively connecting the signal pads of connecting ports of the high-frequency integrated circuit and the signal lines of the dielectric substrates.

According to the invention, a high-frequency characteristic evaluation can be carried out with ease and high accuracy and in a short time. By extension, a high-frequency integrated circuit, which has three terminals or more, can be configured which is excellent in a high-frequency characteristic and low in cost.

Further, it is possible to reduce variations in electrical characteristic and enhance yields. By extension, a high-frequency circuit device low in cost and having high reliability can be configured.

Other and further objects, features and advantages of the invention will appear more fully from the following description.

DETAILED DESCRIPTION OF THE PREFERRED EMBODIMENTS

First Embodiment

Figure 1:
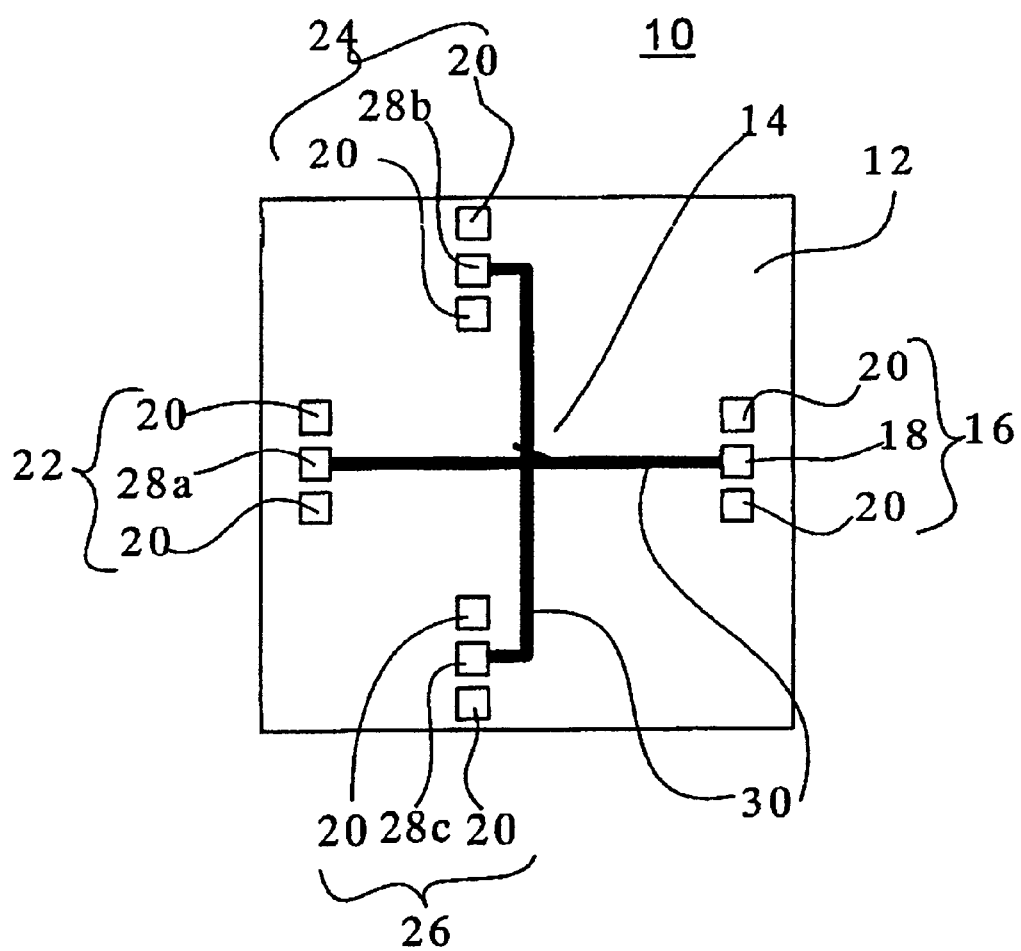
FIG. 1 is a plan view showing a switch MMIC chip according to a first embodiment of the present invention.

FIG. 1 is a plan view of a switch MMIC chip according to the first embodiment.

In FIG. 1, reference numeral 10 indicates a switch MMIC chip which has an SP3T configuration. Reference numeral 12 indicates a semi-insulating GaAs substrate used as a semiconductor substrate, which has a size of about 2 mm in length and width. Reference numeral 14 indicates a switching element disposed inside the GaAs substrate. The switching element 14 is typically illustrated in FIG. 1. Reference numeral 16 indicates an RF signal input terminal used as a first connecting port. Reference numeral 18 indicates an RF signal input pad. Reference numerals 20 indicate grounding pads arranged along one side of the GaAs substrate 12 with the RF signal input pad 18 centrally interposed therebetween. The RF signal input terminal 16 comprises the RF signal input pad 18 and the grounding pads 20.

The grounding pads 20 are connected to a grounding conductor at the back of the chip via through holes (not shown) which normally adjoin each other. In a coplanar line type MMIC, however, grounding pads might be connected to one another on the surface thereof alone.

Reference numerals 22, 24 and 26 indicate RF signal output terminals set as fourth, second and third connecting ports respectively. Reference numerals 28 indicate RF signal output pads. Of these, reference numeral 28a indicates an RF signal output pad of the RF signal output terminal 22, reference numeral 28b indicates an RF signal output pad of the RF signal output terminal 24, and reference numeral 28c indicates an RF signal output pad of the RF signal output terminal 26. The grounding pads 20 are disposed on both sides of the RF signal output pads 28a, 28b and 28c with the RF signal output pads centrally interposed therebetween respectively. Thus, the RF signal input terminal 16 and the RF. signal output terminals 22, 24 and 26 constitute G-S-G pad structures respectively.

Further, the directions of arrangements of the respective RF signal output pads 28a, 28b and 28c of the RF signal output terminals 22, 24 and 26, and the grounding pads 20 adjacent thereto are placed in parallel with the direction of an arrangement of the RF signal input pad 18 and grounding pads 20 of the RF signal input terminal 16.

These pads are formed in squares having sizes ranging from 80 μm to 150 μm. The interval between each of the RF signal input pad 18 and RF signal output pads 28a, 28b and 28c and each of the grounding pads ranges from about 100 μm to about 200 μm. Further, these pads are formed by Au plating.

Reference numerals 30 indicate wiring layers corresponding to signal lines, which are formed by Au plating, vapor deposition or the like.

The path between the RF signal input terminal 16 and the RF signal output terminal 22 and the path between the RF signal output terminal 24 and the RF signal output terminal 26 correspond to main lines over which a high-frequency signal propagates. The path between the RF signal input terminal 16 and the RF signal output terminal 22 constitutes a linear path via the switching element 14. The path between the RF signal output terminal 24 and the RF signal output terminal 26 constitutes a linear path orthogonal to the path between the RF signal input terminal 16 and the RF signal output terminal 22 via the switching element 14.

Therefore, the path between the RF signal input terminal 16 and the RF signal output terminal 22 serves as a straight path. Further, the path between the RF signal input terminal 16 and the RF signal output terminal 24 and the path between the RF signal input terminal 16 and the RF signal output terminal 26 serve as bend paths respectively.

Figure 2:
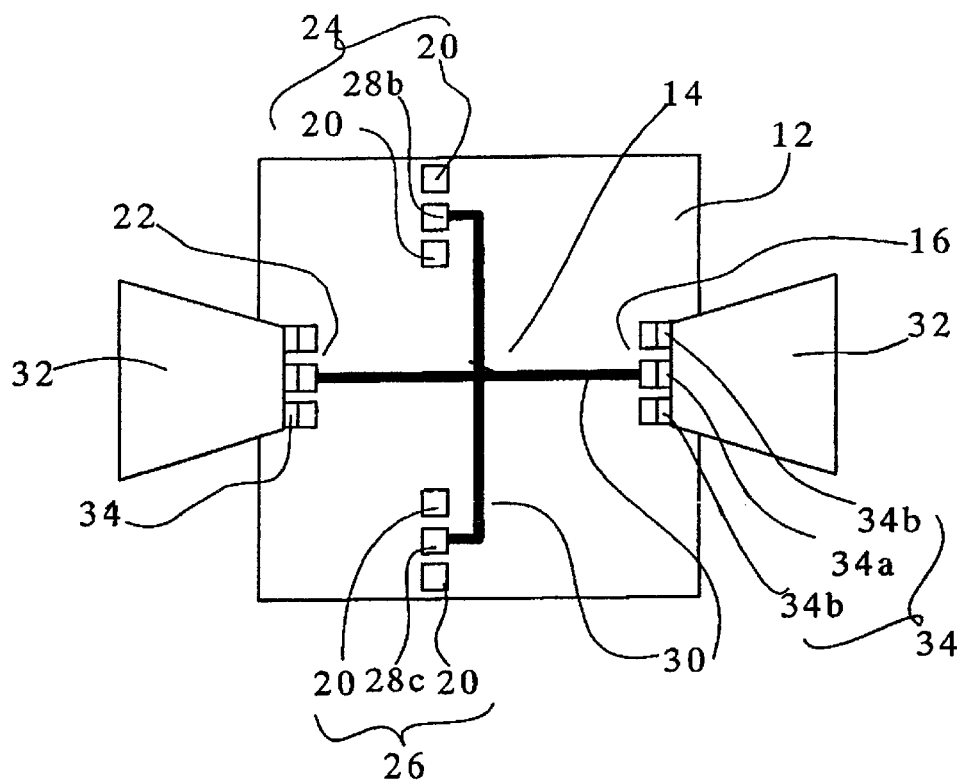
FIG. 2 is a typical view illustrating the state of measurement of a pass characteristic of the switch MMIC chip according to the first embodiment of the present invention.
Figure 3:
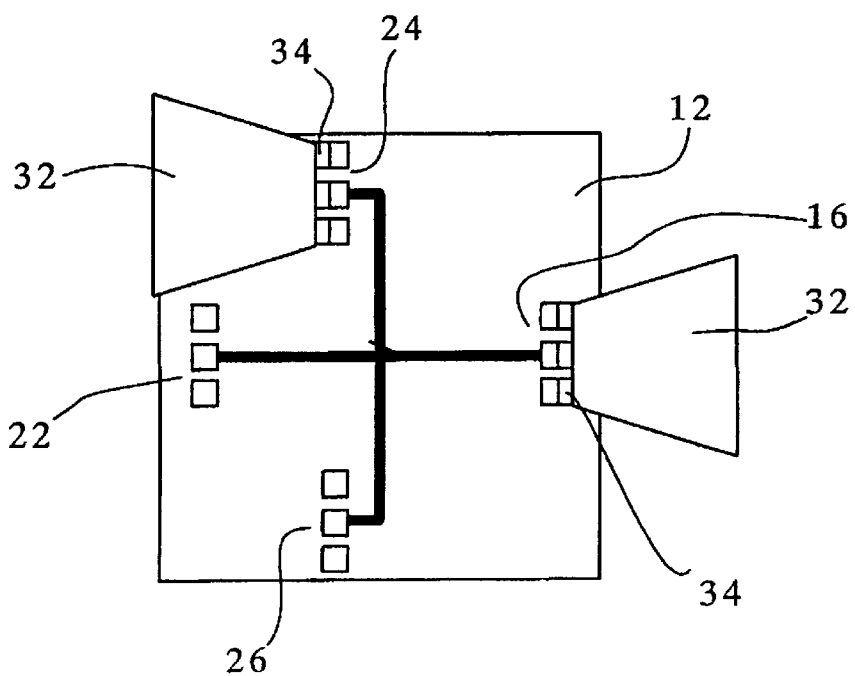
FIG. 3 is a typical view depicting the state of measurement of a pass characteristic of the switch MMIC chip according to the first embodiment of the present invention.
Figure 4:
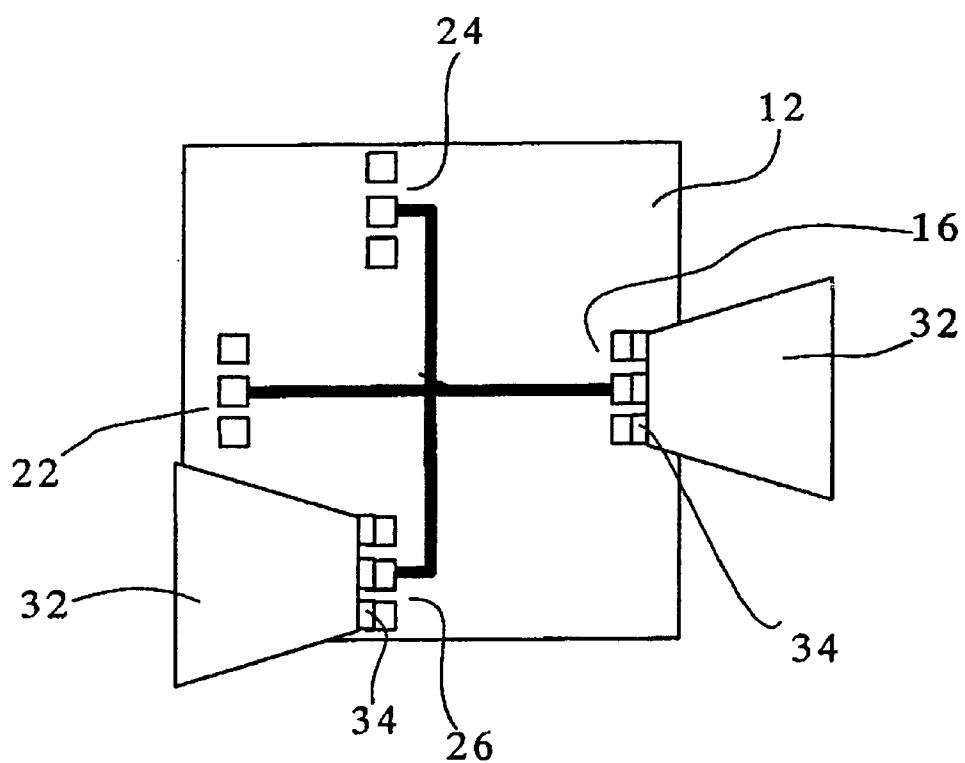
FIG. 4 is a typical view showing the state of measurement of a pass characteristic of the switch MMIC chip according to the first embodiment of the present invention.

FIGS. 2, 3 and 4 are respectively typical views showing the states of measurement of S parameters used as guides or indexes of pass characteristics of the MMIC chip 10. This measurement is normally carried out in an on-wafer state.

In FIGS. 2, 3 and 4, reference numerals 32 indicate probe heads respectively. Reference numerals 34 indicate probes, reference numerals 34a indicate signal probes, and reference numerals 34b indicate grounding probes respectively. The probe head 32 has a G-S-G (Ground-Signal-Ground) structure. The layouts of the signal probes 34a and grounding probes 34b correspond to the layouts of the signal pads and grounding pads of the RF signal input terminal 16 and RF signal output terminals 22, 24 and 26, respectively.

In FIG. 2, the probe heads 32 are respectively kept in a state placed for the measurement of an S parameter indicative of a pass characteristic between the RF signal input terminal 16 and the RF signal output terminal 22 (hereinafter called "a-path").

Since the a-path indicates a straight-path measurement, the direction of an arrangement of the RF signal input pad 18 and grounding pads 20 of the RF signal input terminal 16 and the direction of an arrangement of the RF signal output pad 28a and grounding pads 20 of the RF signal output terminal 22 are placed in parallel with each other. Therefore, the probe heads 32 are respectively placed on the RF signal input terminal 16 and the RF signal output terminal 22 so as to be opposite to each other, and measure an S parameter.

In FIG. 3, the probe heads 32 are respectively kept in a state placed for the measurement of an S parameter indicative of a pass characteristic between the RF signal input terminal 16 and the RF signal output terminal 24 (hereinafter called "b-path").

Since the direction of an arrangement of the RF signal input pad 18 and grounding pads 20 of the RF signal input terminal 16 and the direction of an arrangement of the RF signal output pad 28b and grounding pads 20 of the RF signal output terminal 24 are placed in parallel with each other while the b-path indicates a bend-path measurement, it is not necessary to change the orientation of the probe head 32 on the RF signal output terminal 24 side. Merely adjusting its position makes it possible to measure the S parameter for the b-path.

In FIG. 4, the probe heads 32 are respectively kept in a state placed for the measurement of an S parameter indicative of a pass characteristic between the RF signal input terminal 16 and the RF signal output terminal 26 (hereinafter called "c-path").

It is unnecessary to change the orientation of the probe head 32 on the RF signal output terminal 26 side in a manner similar to the b-path even in the case of the c-path. A mere adjustment to its position allows the measurement of the S parameter.

Since the intervals among the respective RF signal output terminals 22, 24 and 26 normally range from about 1 mm to about 3 mm, and a movable range of a manipulator is ±10 mm or so, the transfer of the probe head to each of the RF signal output terminals 22, 24 and 26 is allowed by simply adjusting the position of the probe head 32.

Thus, the MMIC chip having the conventional structure wherein the direction of an arrangement of the RF signal output pads of the RF signal output terminals and the grounding pads thereof adjacent to them might not be placed in parallel with the direction of an arrangement of the RF signal input pad and grounding pads of the RF signal input terminal, has spent much time to reconstruct and recorrect a measurement system as occasion demands. However, the MMIC chip according to the present embodiment can eliminate the need for manual working for the attachment and change of the probe heads and can be evaluated with respect to all the paths under the same measurement system and correction.

Therefore, the number of times that the probe heads contact, can be reduced, the degree of their wastage can be lowered, and the measuring cost can be reduced, thereby making it possible to obtain an inexpensive MMIC. Since the evaluation can be made to all the paths under the same correction, an MMIC having a uniform characteristic can be obtained wherein variations in measurement accuracy are reduced and variations in a high-frequency characteristic are reduced. Further, the working of attachment and change of the probe head decreases and the opportunity of causing damage to an expensive probe head is reduced, whereby an inexpensive MMIC can be obtained.

Further, each S parameter can easily be measured and the time necessary for its working can also be shortened. As a result, an inexpensive MMIC can be obtained.

Figure 5:
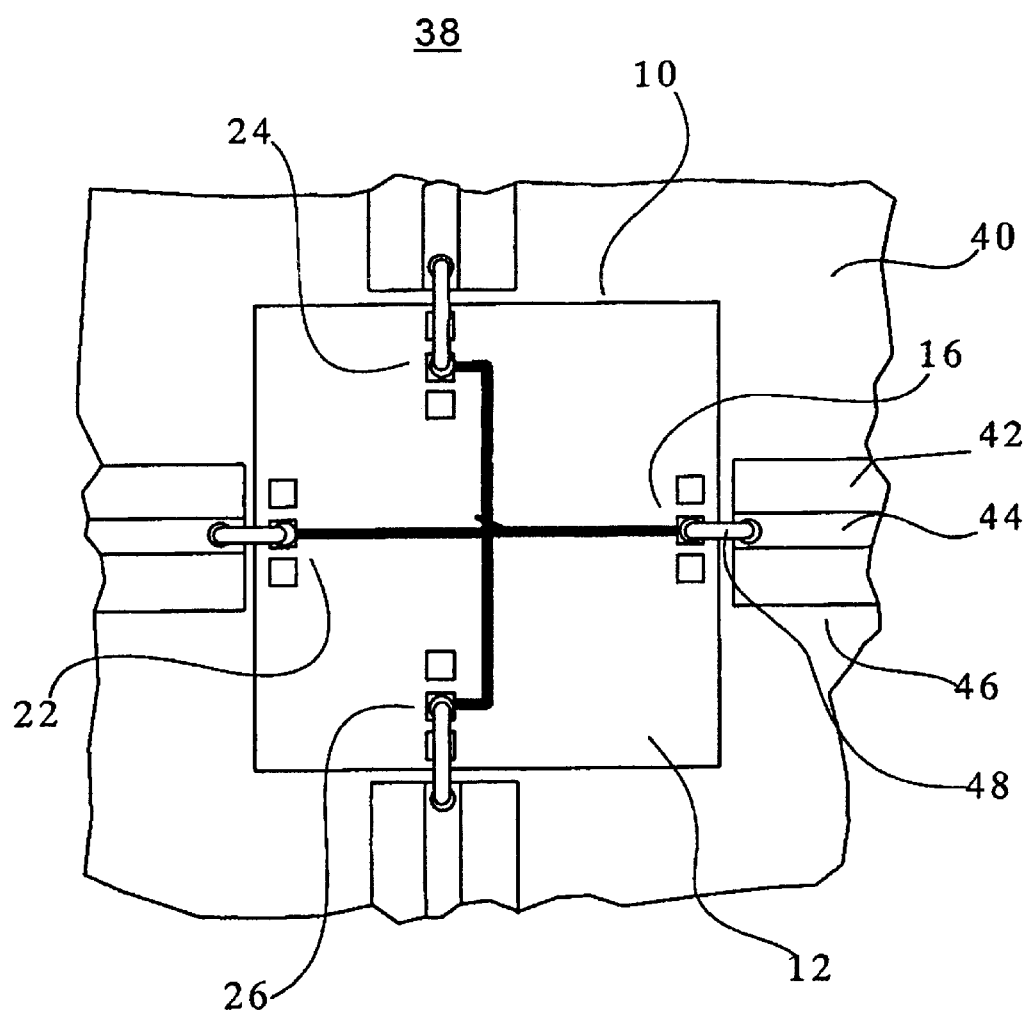
FIG. 5 is a partly plan view illustrating part of a module on which the switch MMIC chip according to the first embodiment of the present invention is implemented.

FIG. 5 is a partly plan view showing part of the interior of a high-frequency circuit device, e.g., a module or package on which the switch MMIC chip according to the first embodiment is implemented.

Incidentally, the package is a relatively small one used with one MMIC chip having a generally single-function being contained therein. The module is a relatively large one used with generally plural MMIC chips, capacitors or other circuits parts contained therein. However, a package might be used with a plurality of semiconductor chips charged therein. There is also known a module comprising one MMIC. Therefore, the difference between the two is not so strict. Thus, a term of the module will be used below. It will be regarded as the meaning of the module and/or package.

In FIG. 5, reference numeral 38 indicates a module, and reference numeral 40 indicates a metal base used as a mounting substrate, i.e., a base for the module. The metal base 40 is grounded. While the metal base is used here, it may be conductive ceramic which makes use of alumina or the like. The MMIC chip 10 is fixed to the metal base 40 with AuSn or an adhesive. Reference numerals 42 indicate MIC substrates used as dielectric substrates, each of which is formed of a dielectric such as alumina.

The MIC substrate 42 is fixed to the metal base 40 with a conductive adhesive. Reference numerals 44 indicate wiring layers each disposed on the surface of the MIC substrate 42 and formed of Au. The dielectric substrate 42 and the wiring layer 44 constitute a microstrip line 46 in conjunction with a ground layer on the back of the dielectric substrate 42.

Reference numerals 48 indicate bonding wires used as connecting conductors, each of which connects the wiring layer 44 of the microstrip line 46 and the RF signal input pad 18 or the RF signal output pads 28.

For example, the module 38 is activated as follows:

A high-frequency signal RF propagated through the microstrip line 46 is supplied to the RF signal input terminal 16 through its corresponding bonding wire 48. The high-frequency signal RF is suitably switched to the RF signal output terminals 22, 24 and 26 by the switching element 14. Further, the high-frequency signal RF is supplied to the microstrip line 46 through the bonding wire 48, followed by propagation through the microstrip line 46.

Since the MMIC chip 10 is capable of measuring and selecting a high-frequency characteristic with satisfactory accuracy in a wafer stage, the module 38 can be provided as a product in which variations in a high-frequency characteristic are reduced. Since the bonding wires are also used, the module can be simplified in structure and easily manufactured.

Figure 6:
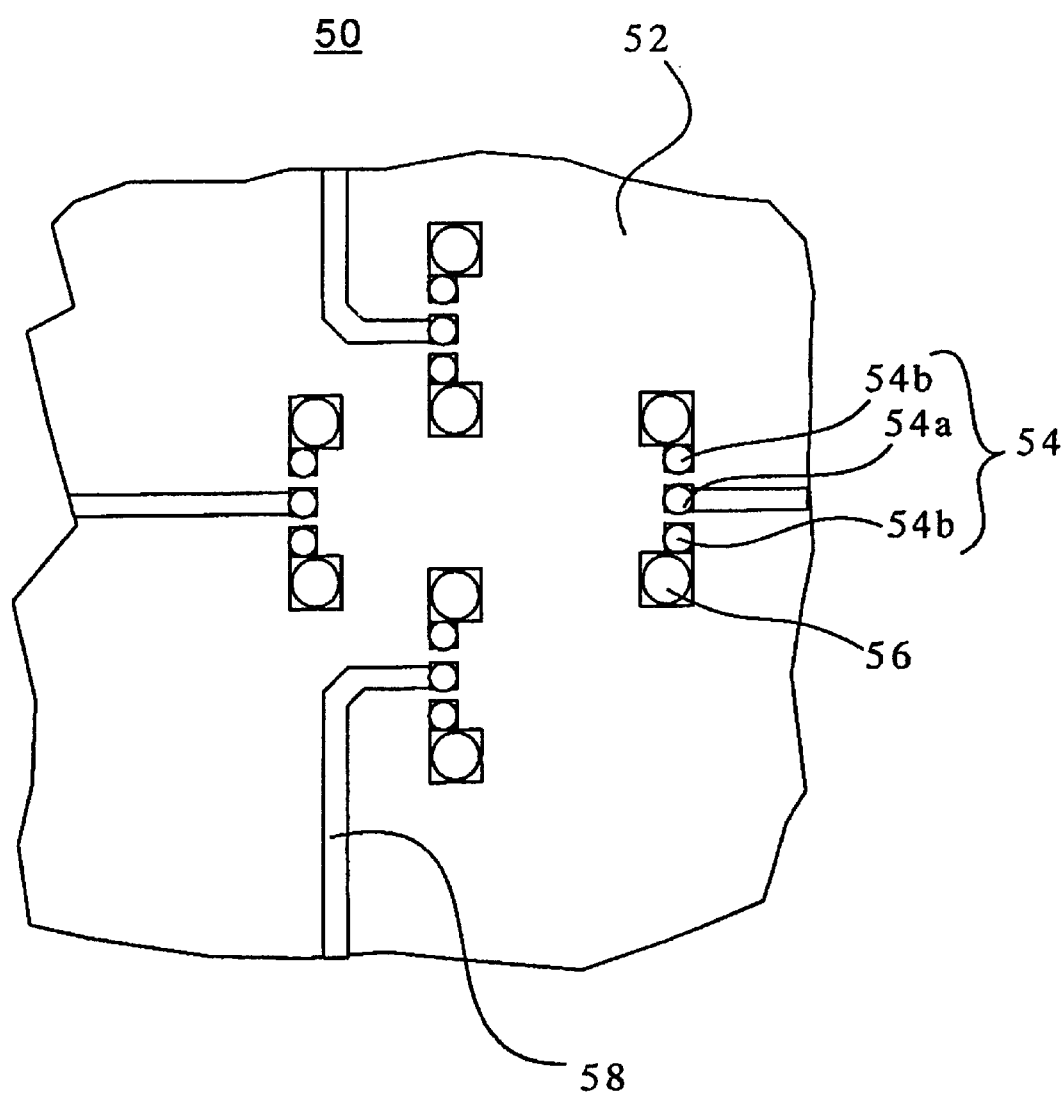
FIG. 6 is a partly plan view showing a flip-chip mounted substrate employed in a module according to the first embodiment of the present invention.

FIG. 6 is a partly plan view of a flip-chip mounted substrate employed in a module according to the present embodiment.

In FIG. 6, reference numeral 50 indicates a flip-chip mounted substrate used as a dielectric substrate. Reference numeral 52 indicates a substrate body which makes use of alumina or the like. Reference numerals 54 indicate bumps for the implementation of a flip chip. Reference numeral 54a indicates a bump for a signal line, and reference numerals 54b indicate grounding bumps. Reference numerals 56 indicate grounding through holes, and reference numerals 58 indicate signal wiring layers. The grounding bumps 54b connected to the through holes 56 are connected to a grounding conductor at the back of the substrate via the through holes 56. The wiring layers 58 are connected to their corresponding bumps 54a for the signal line. In a coplanar line type substrate, the grounding bumps might be connected to one another only on the surface thereof.

The direction of an arrangement and alignment of these bumps 54a and grounding bumps 54b corresponds to the direction of an arrangement and alignment of the RF signal input pad 18 of the RF signal input terminal 16 of the MMIC chip placed on theses bumps 54a for the signal line and grounding bumps 54b, and the RF signal output pads and grounding pads 20 of the RF signal output terminals 22, 24 and 26 placed thereon.

Figure 7:
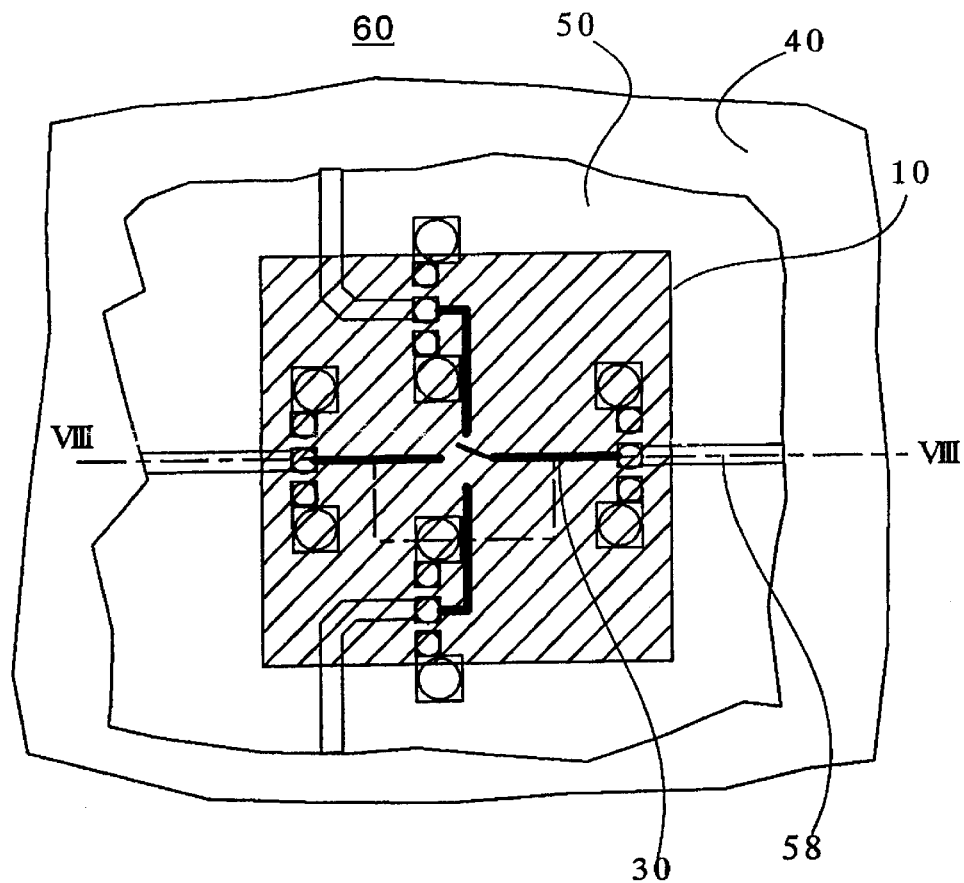
FIG. 7 is a partly plan view illustrating, in a partly seen-through form, a module on which the switch MMIC chip according to the first embodiment of the present invention is flip-chip mounted.
Figure 8:
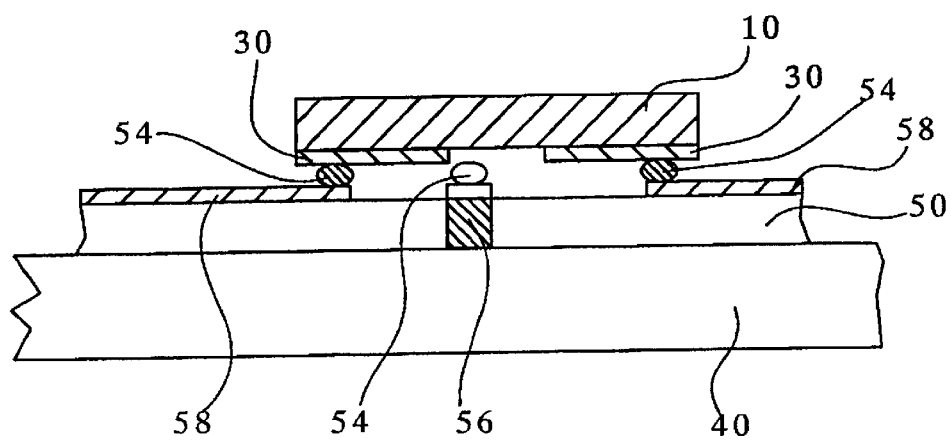
FIG. 8 is a cross-sectional view taken along line VIII—VIII of the module shown in FIG. 7.

FIG. 7 is a partly plan view showing, in a partly seen-through form, a module on which the switch MMIC chip according to the present embodiment of the present invention is flip-chip mounted, and FIG. 8 is a cross-sectional view taken along line VIII—VIII of FIG. 7, respectively.

In FIGS. 7 and 8, reference numeral 60 indicates a module. The MMIC chip is disposed face down, i.e., an RF signal input pad 18 of an RF signal input terminal 16 and RF signal output pads 28 of RF signal output terminals 22, 24 and 26 are placed so as to be opposite to a flip-mounted substrate 50. The RF signal input pad 18 and the RF signal output pads 28 are placed on their corresponding bumps 54 and bonded to one another with adhesives (not shown) used as connecting conductors.

Further, flip-chip mounting free of the use of the bumps 54 might be executed.

Since no bonding wires are used in the module 60 to which the flip-chip mounting is made in this way, the module 60 does not cause an increase in inductance and is excellent in a high-frequency characteristic even if the layout positions of the RF signal input pad 18 of the RF signal input terminal 16 and the RF signal output pads of the RF signal output terminals 22, 24 and 26 are formed inside the substrate away from its substrate peripheral edge. Therefore, the degree of freedom of design further increases. As such a high-frequency module that the layout of circuit parts influences an electrical characteristic in particular, a product having a high electrical characteristic can be provided.

As to wire bonding, variations in inductance due to variations in the length of each bonding wire might take place. Further, variations in frequency characteristic, which are caused by the variations in inductance, might occur. However, the flip-chip mounted module 60 lessens such variations and enhances product yields. Accordingly, a module high in reliability and low in cost can be offered.

Second Embodiment

Figure 9:
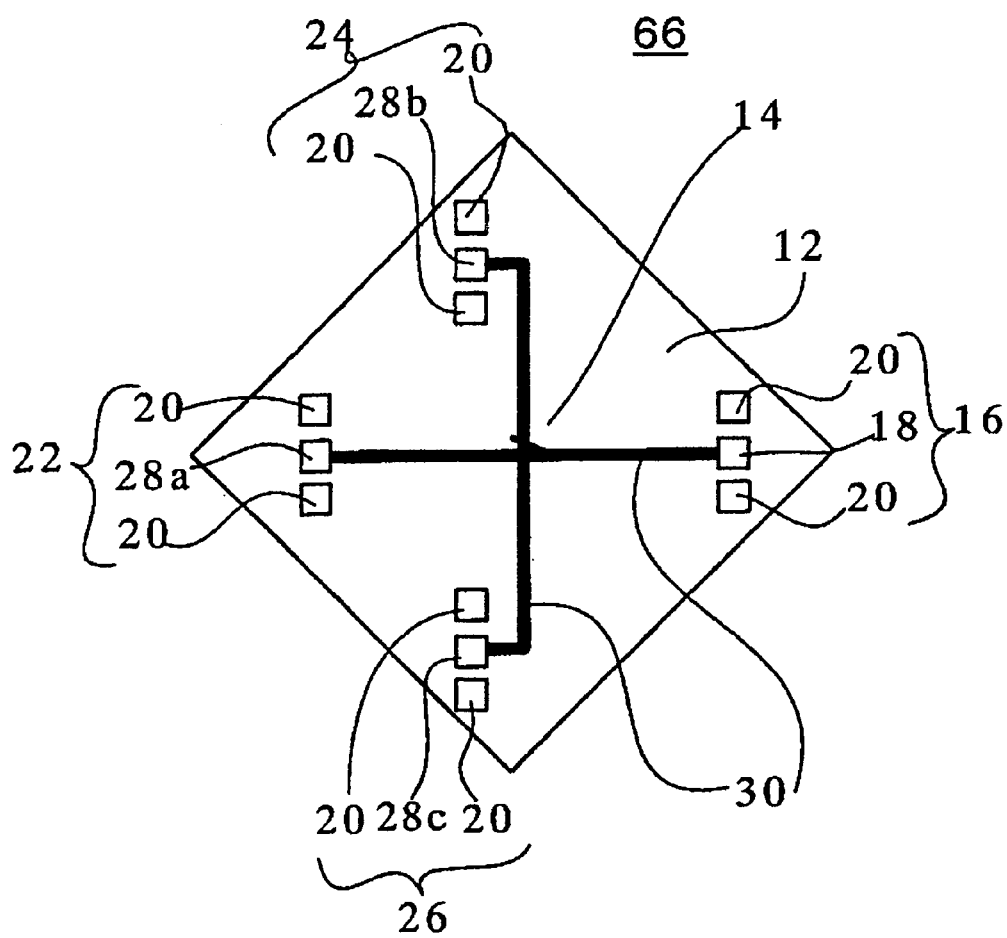
FIG. 9 is a plan view showing a switch MMIC chip according to a second embodiment of the present invention.

FIG. 9 is a plan view showing a switch MMIC chip according to the second embodiment.

The same reference numerals as those employed in the switch MMIC chip according to the first embodiment show the same or equivalent ones. This is similar even to the case of the following embodiments.

In FIG. 9, reference numeral 66 indicates an MMIC chip. The MMIC chip 66 is identical to the MMIC chip 10 according to the first embodiment in terms of the layout of the RF signal input terminal 16 and the RF signal output terminals 22, 24 and 26. However, dicing lines for the MMIC chip 10 extend parallel to the main lines, whereas dicing lines for the MMIC chip 66 are formed so as to be inclined 45° toward main lines orthogonal to the dicing lines. Namely, the RF signal input terminal 16 and the RF signal output terminals 22, 24 and 26 are placed in the corners of a substrate.

Therefore, the MMIC chip 66 can be formed in a small substrate area as compared with the MMIC chip 10.

Figure 10:
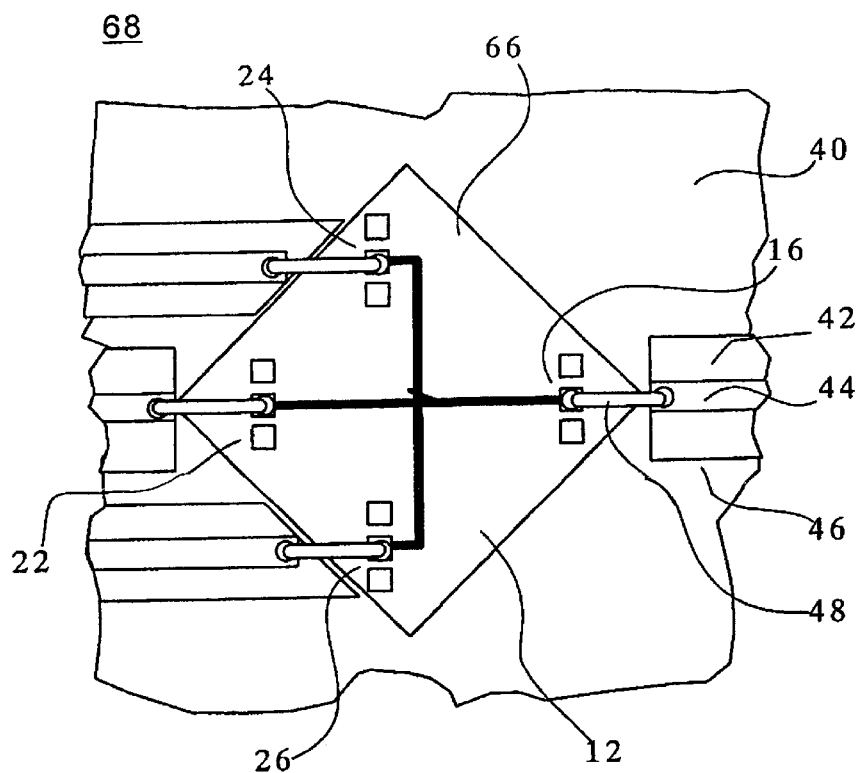
FIG. 10 is a partly plan view depicting part of a module on which the switch MMIC chip according to the second embodiment of the present invention is implemented.

FIG. 10 is a partly plan view showing part of the interior of a high-frequency circuit device, e.g., a module on which the switch MMIC chip according to the second embodiment is implemented.

Reference numeral 68 indicates a module. When a microstrip line 46 connected to the RF signal input terminal 16 and microstrip lines 46 connected to the RF signal output terminals 22, 24 and 26 are placed in parallel in the module 68, bonding wires for respectively connecting RF signal output pads 28b and 28c of the RF signal output terminals 24 and 26 and the microstrip lines 46 become short. It is therefore possible to enhance a high-frequency characteristic. Further, all the bonding wires 48 can be made nearly equal to one another in length and can be made uniform in inductance. Thus, variations in a high-frequency characteristic of the module can be reduced.

Third Embodiment

Figure 11:
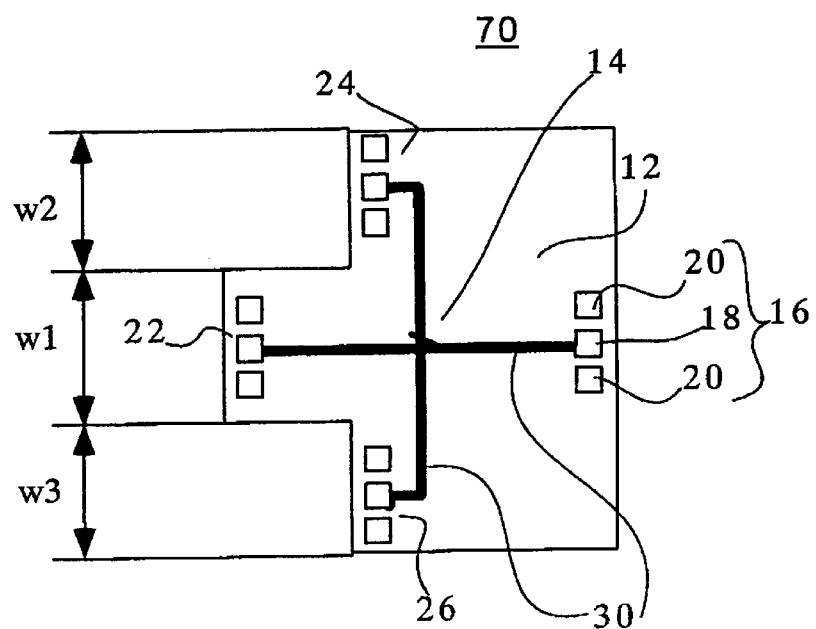
FIG. 11 is a plan view illustrating a switch MMIC chip according to a third embodiment of the present invention.
Figure 12:
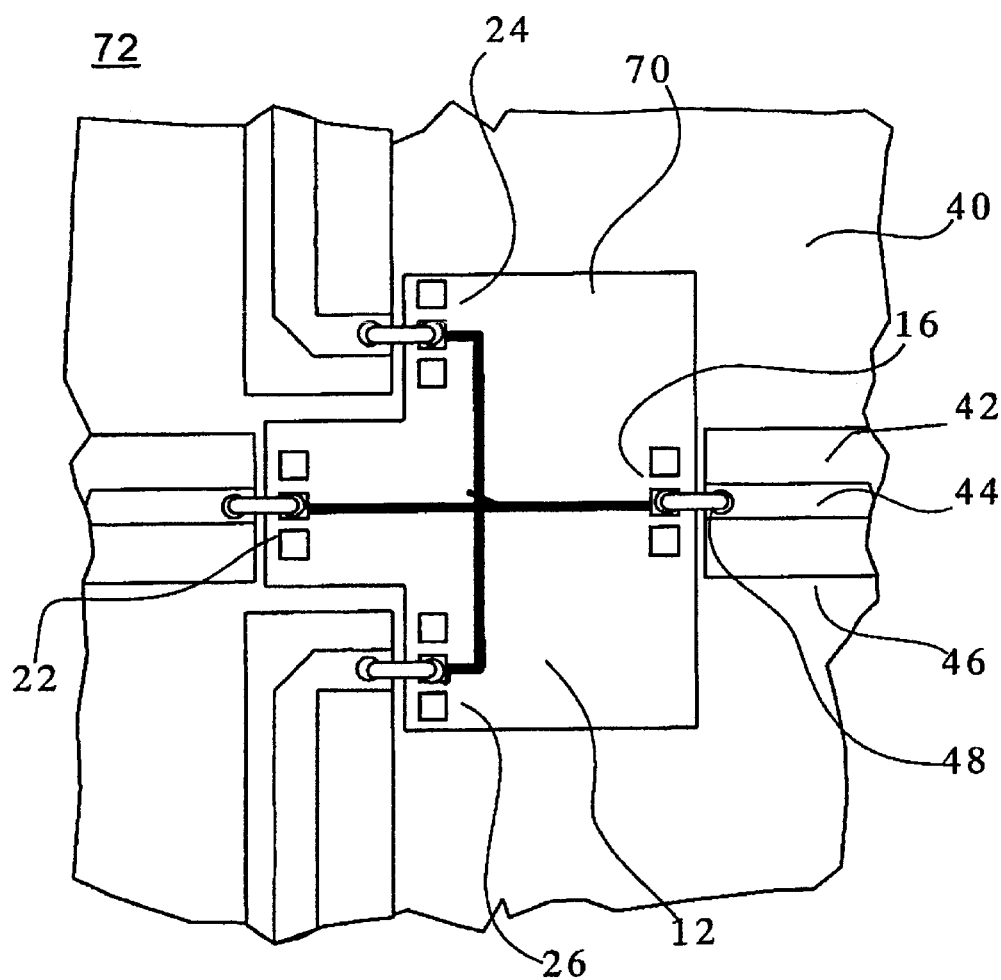
FIG. 12 is a partly plan view showing part of a module on which the switch MMIC chip according to the third embodiment of the present invention is implemented.

FIG. 11 is a plan view showing a switch MMIC chip according to the third embodiment. FIG. 12 is a partly plan view showing part of the interior of a high-frequency circuit device, e.g., a module on which the switch MMIC chip according to the third embodiment is implemented.

In FIG. 11, reference numeral 70 indicates an MMIC chip. The MMIC chip 70 is identical to the MMIC chip 10 according to the first embodiment in terms of the layout of the RF signal input terminal 16 and the RF signal output terminals 22, 24 and 26. However, the MMIC chip 10 is a quadrangle having the sides parallel to the main lines, whereas the MMIC chip 70 is one wherein the shape of a substrate is made convex so that RF signal output pads 28a, 28b and 28c of RF signal output terminals 22, 24 and 26 all come close to their corresponding peripheral edges of the substrate, the RF signal output terminal 22 is placed on its corresponding upper side of a convex protruded portion, and the RF signal output terminals 24 and 26 adjoin each other along their corresponding lower sides on both sides of the protruded portion.

In FIG. 12, reference numeral 72 indicates a module. Since the RF signal output pads 28a, 28b and 28c of the RF signal output terminals 22, 24 and 26 are all close to the peripheral edges of the substrate as indicated by the module 72, bonding wires 48 for connecting the RF signal output pads 28a, 28b and 28c and their corresponding microstrip lines 46 become short. Therefore, a high-frequency characteristic is improved. Further, all the bonding wires 48 can be nearly equal to one another in length and can be made uniform in inductance. Thus, variations in a high-frequency characteristic of the module can be reduced.

Figure 13:
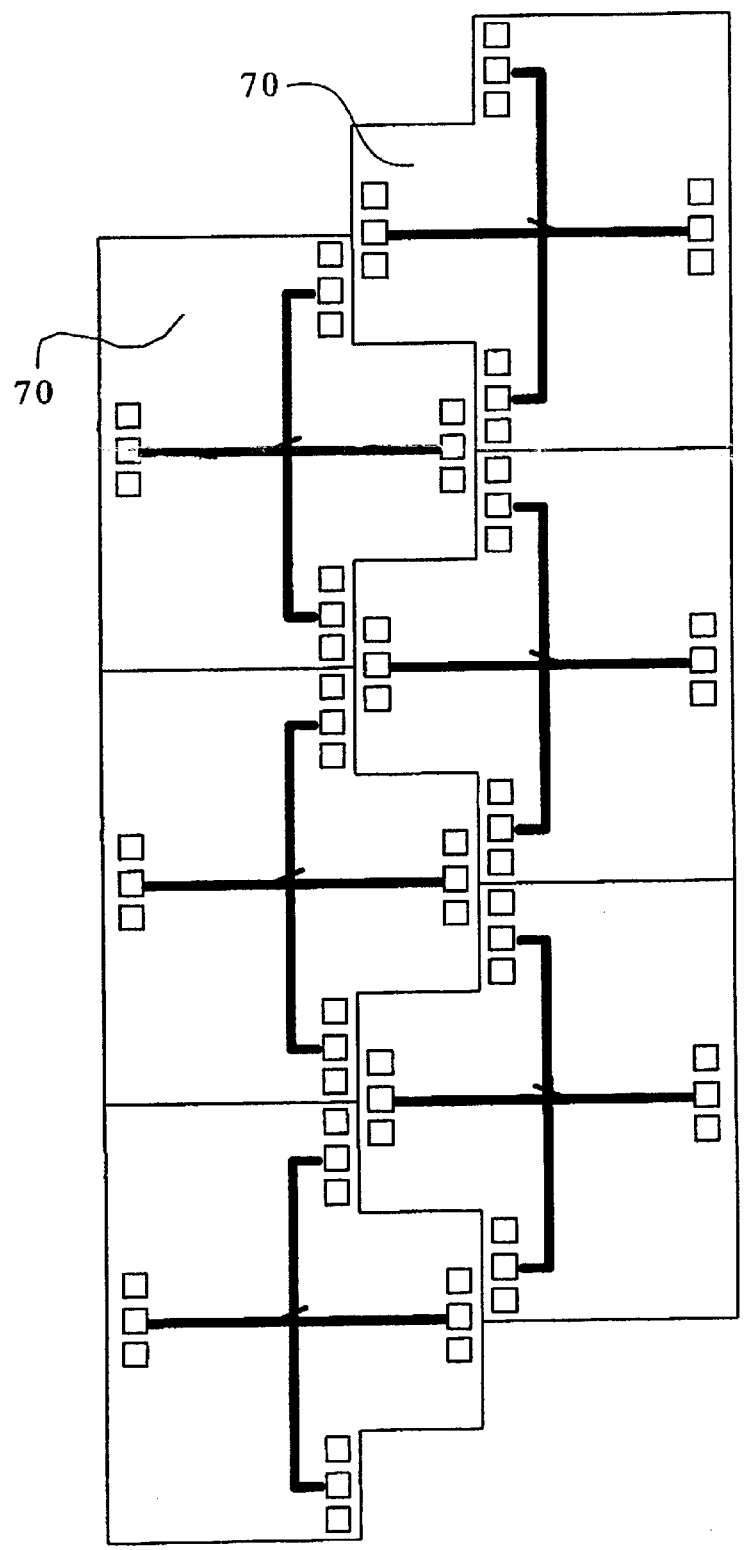
FIG. 13 is a typical view illustrating the arrangement of the MMIC chips according to the third embodiment of the present invention on a wafer.

FIG. 13 is a typical view showing the arrangement of MMIC chips 70 according to the present embodiment on a wafer.

Assuming that in FIG. 12, the length of an upper side of a convex protruded portion of the MMIC chip 70 is defined as w1, and the lengths of lower sides thereof on its both sides are defined as w2 and w3, e.g., w2=w3 and w1=2×w2, the protruded portions are caused to adjoin one another as shown in FIG. 13, and thereby the MMIC chips 70 can be arranged on the wafer. Owing to the arrangement thereof in this way, the MMIC chips 70 can be reduced in area and cut efficiently.

Incidentally, such a chip form makes it difficult to separate the chips by use of a normal dicing saw. However, the chip separation can easily be carried out by use of methods such as laser cutting and etch cutting.

Fourth Embodiment

Figure 14:
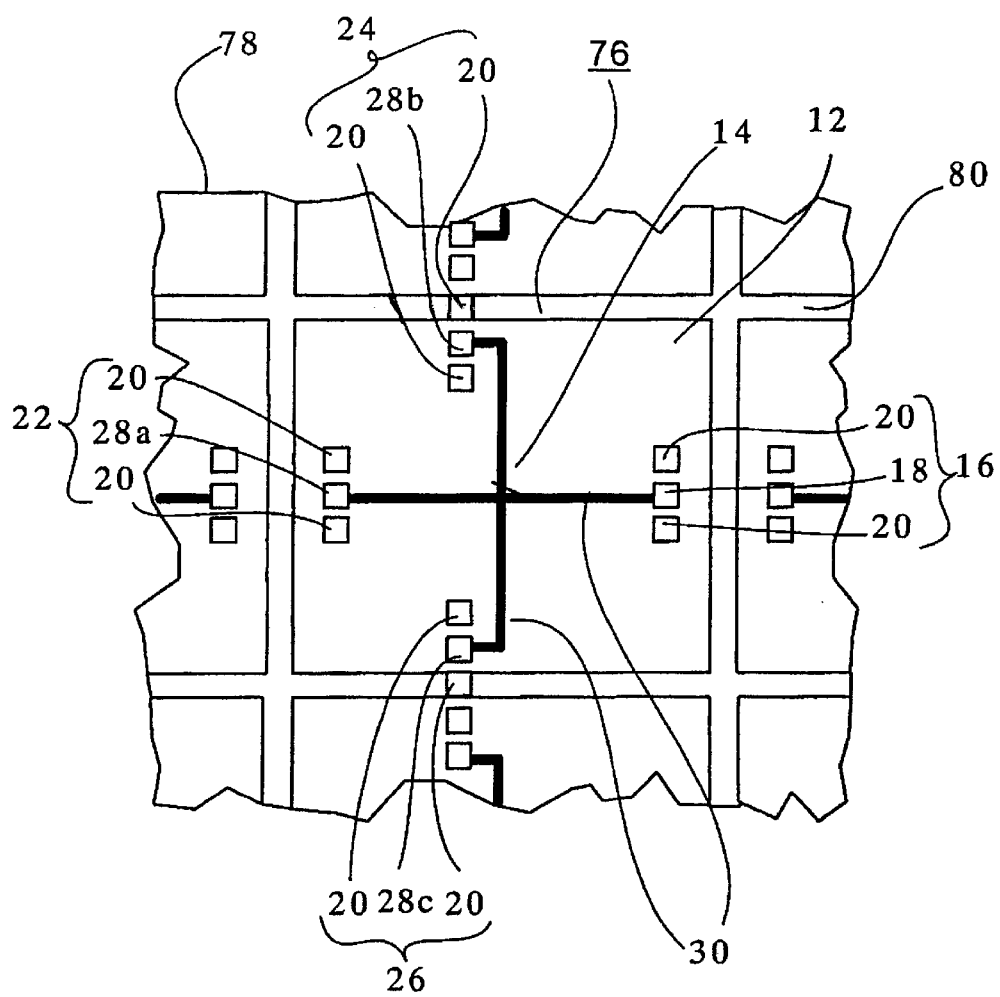
FIG. 14 is a partly plan view depicting a switch MMIC chip according to a fourth embodiment of the present invention on a wafer.
Figure 15:
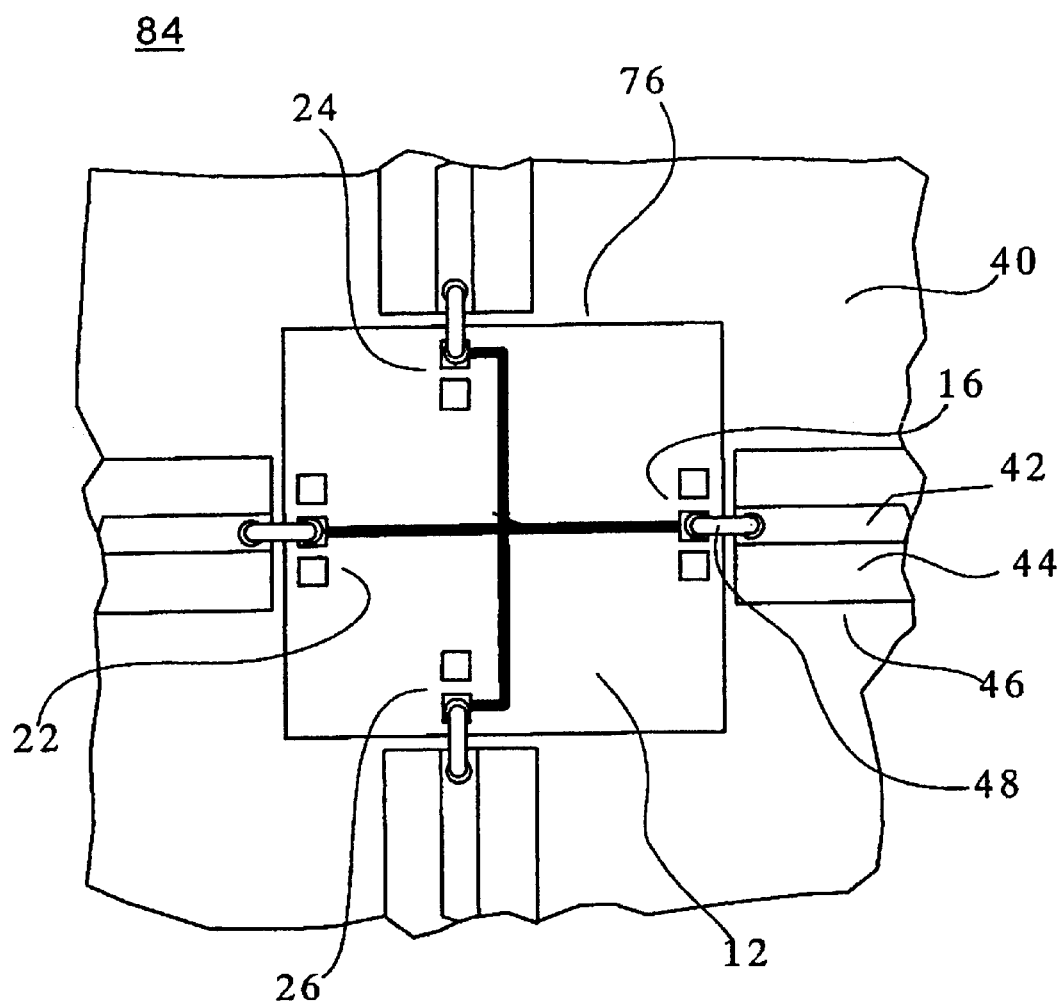
FIG. 15 is a partly plan view showing part of a module on which the switch MMIC chip according to the fourth embodiment of the present invention is implemented.

FIG. 14 is a partly plan view showing a switch MMIC chip according to the fourth embodiment on a wafer. FIG. 15 is a partly plan view showing part of the interior of a high-frequency circuit device, e.g., a module on which the switch MMIC chip according to the fourth embodiment is implemented.

In FIG. 14, reference numeral 76 indicates a switch MMIC, reference numeral 78 indicates a wafer on which the switches MMIC 76 are placed, and reference numeral 80 indicates a dicing line.

Since the direction of an arrangement of an RF signal input pad 18 and grounding pads 20 extends parallel to one peripheral edge of a GaAs substrate 12, an RF signal input terminal 16 and an RF signal output terminal 22 located at both ends of a main line used as a line through which a high-frequency signal propagates, constitute a G-S-G structure.

However, the direction of an arrangement of RF signal output pads 28b and 28c and grounding pads 20 included in an RF signal output terminal 24 and an RF signal output terminal 26 which respectively constitute ends of a path between the RF signal output terminal 24 and the RF signal output terminal 26, are orthogonal to the peripheral edges of the GaAs substrate 12.

Therefore, if the adjoining grounding pads 20 are left on both sides of the RF signal output pads 28b and 28c, then bonding wires 48 for connecting the RF signal output pads 28b and 28c and their corresponding microstrip lines 46 extend long beyond the grounding pads 20 adjacent to the peripheral edges of the GaAs substrate 12. Thus, one grounding pads 20 are placed outside from the peripheral edges of the GaAs substrate 12 and placed on the dicing line 80.

In doing so, the RF signal output pads 28b and 28c of the RF signal output terminal 24 and RF signal output terminal 26 in each chip-separated MMIC chip approach the peripheral edges of the GaAs substrate 12, and one remaining grounding pads 20 are provided inside the substrate as viewed from the RF signal output pads 28b and 28c. Further, the length of the substrate extending in the direction along the path between the RF signal output terminal 24 and the RF signal output terminal 26 becomes short, and the area of the GaAs substrate 12 for the MMIC chip 76 can be reduced.

In FIG. 15, reference numeral 84 indicates a module. In the module 84, the RF signal input pad 18 of the RF signal input terminal 16 and the RF signal output pads 28a, 28b and 28c of the RF signal output terminals 22, 24 and 26 are all disposed in close to the peripheral edges of the GaAs substrate 12. Therefore, the bonding wires 48 for respectively connecting the respective ones of the RF signal input pad 18 and the RF signal output pads 28a, 28b and 28c and the microstrip lines 46 become short and can be made uniform in length. Accordingly, a high-frequency characteristic can be improved and variations in a high-frequency characteristic of the module can also be reduced.

Fifth Embodiment

Figure 16:
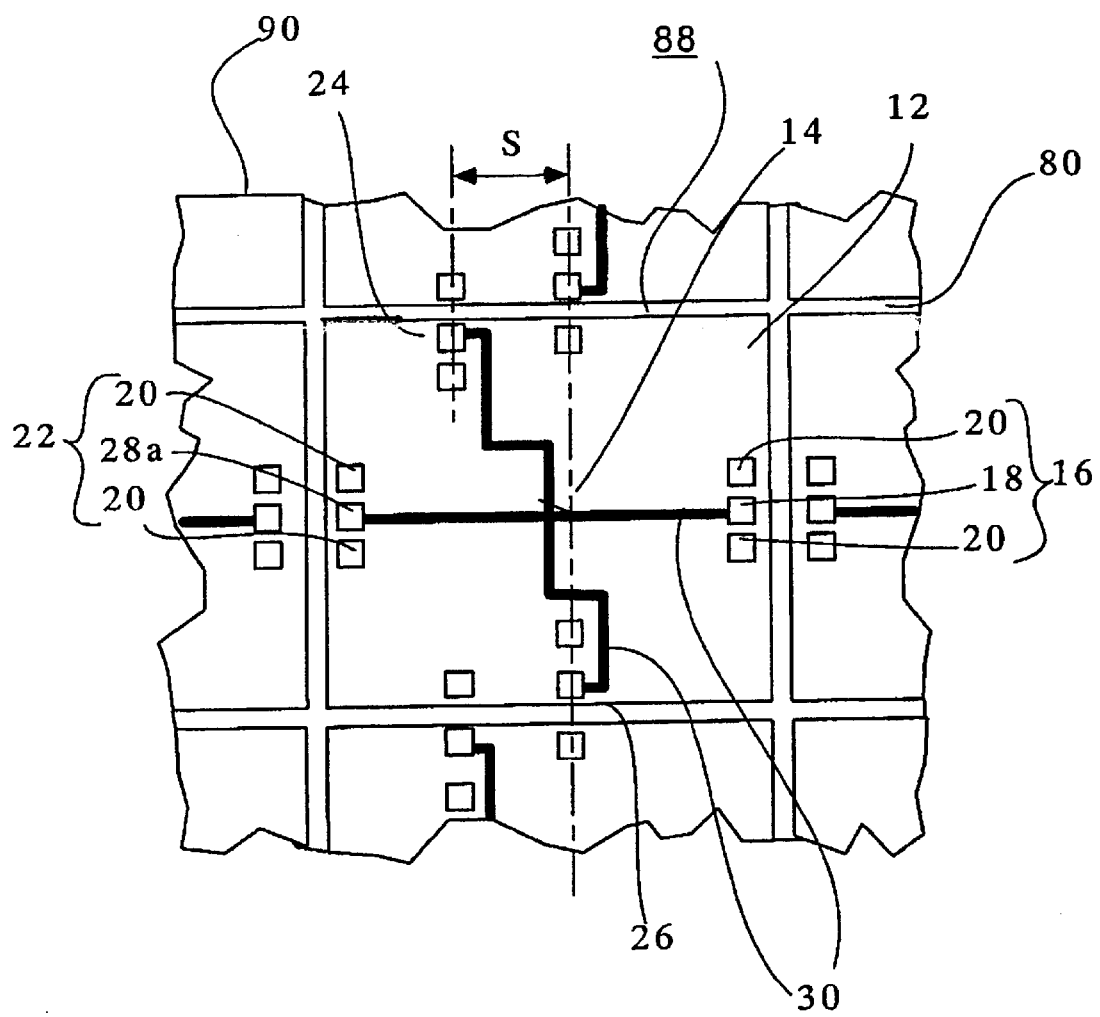
FIG. 16 is a partly plan view illustrating a switch MMIC chip according to a fifth embodiment of the present invention on a wafer.
Figure 17:
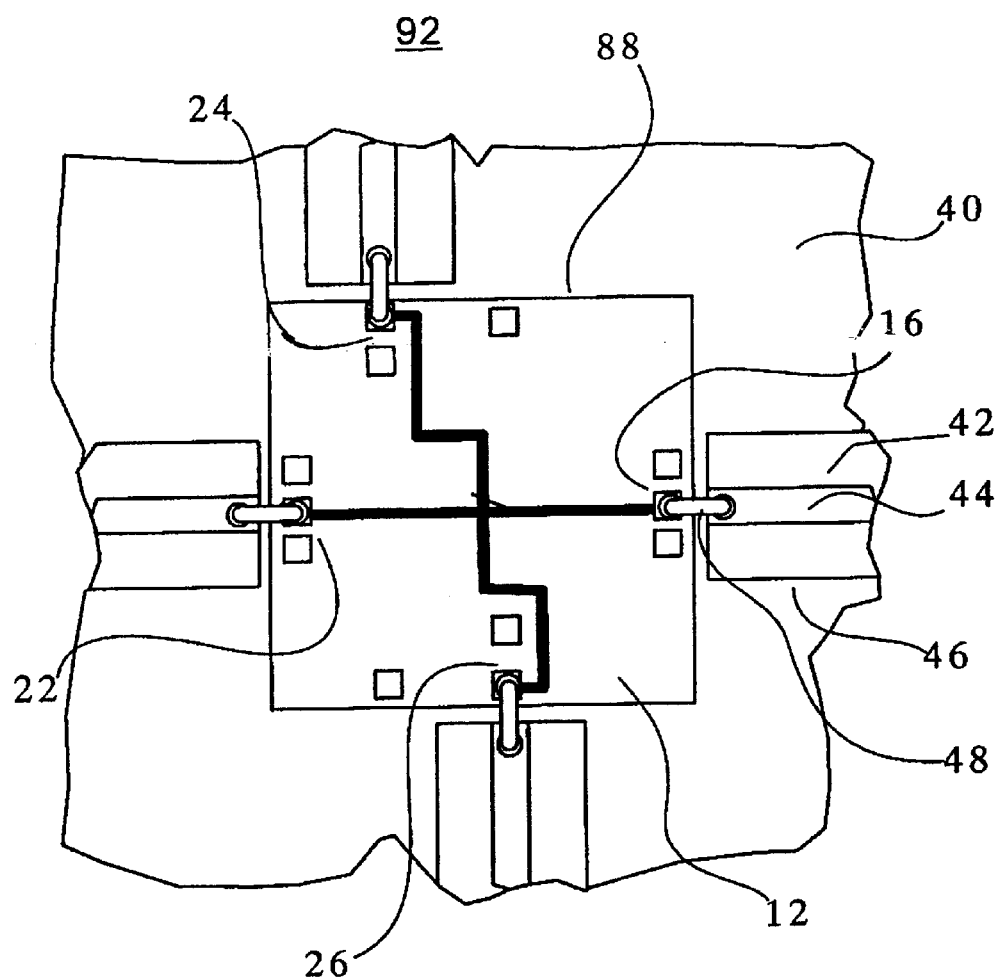
FIG. 17 is a partly plan view depicting part of a module on which the switch MMIC chip according to the fifth embodiment of the present invention is implemented.

FIG. 16 is a partly plan view showing, on a wafer, a switch MMIC chip according to the fifth embodiment. FIG. 17 is a partly plan view showing part of the interior of a high-frequency circuit device, e.g., a module on which the switch MMIC chip according to the fifth embodiment is implemented.

In FIG. 16, reference numeral 88 indicates a switch MMIC, and reference numeral 90 indicates a wafer on which the switches MMIC 88 are placed. Referring to FIG. 17, reference numeral 92 indicates a module on which the switch MMIC 88 is implemented.

In a manner similar to the switch MMIC 76 according to the fourth embodiment, the switch MMIC 88 is identical thereto in that one grounding pads 20 of an RF signal output terminal 24 and an RF signal output terminal 26 are placed outside peripheral edges of a GaAs substrate 12, and after chip separation, RF signal output pads 28b and 28c of the RF signal output terminal 24 and the RF signal output terminal 26 approach the peripheral edges of the GaAs substrate 12 and one remaining grounding pads 20 thereof are placed inside the substrate as viewed from the RF signal output pads 28b and 28c.

However, in order to enhance the degree of freedom of the placement of the RF signal output terminal 24 and RF signal output terminal 26 and eliminate the interference of the grounding pads on the wafer, the interval between a pad central-axis line extending in the direction of an arrangement of the RF signal output pad 28b and grounding pads 20 of the RF signal output terminal 24 and a pad central-axis line extending in the direction of an arrangement of the RF signal output pad 28c and grounding pads 20 of the RF signal output terminal 26 is shifted to greater than or equal to the width of each pad. Namely, the pad central-axis line of the RF signal output terminal 24 and the pad central-axis line of the RF signal output terminal 26 are shifted by S therebetween in FIG. 16.

The degree of freedom of design on the positions of the signal terminals can be enhanced by eliminating mutual interference between the pad layouts on the wafer in this way. Further, the width of a dicing line can freely be set.

Sixth Embodiment

Figure 18:
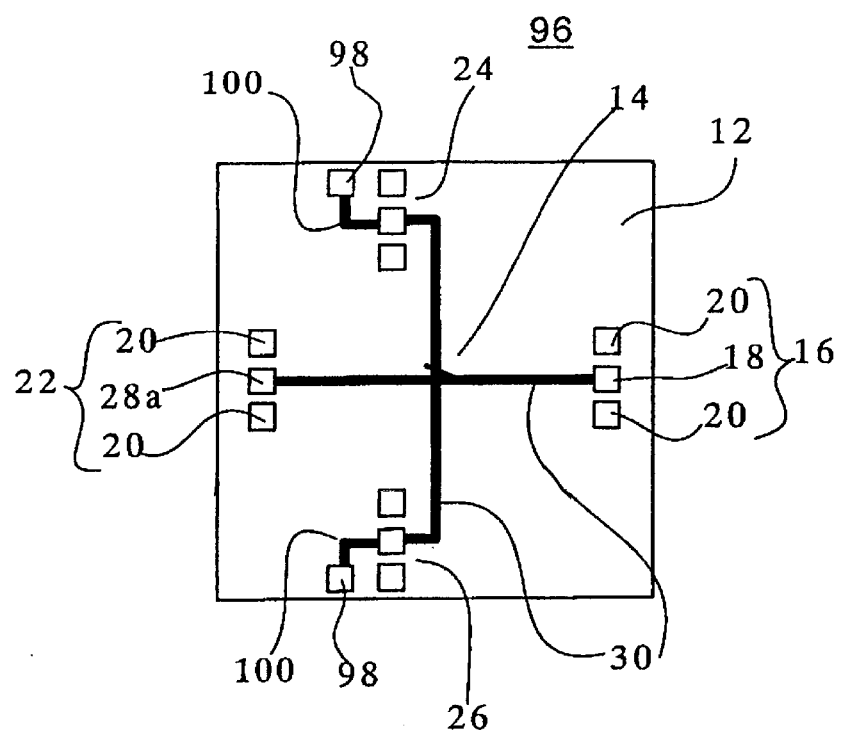
FIG. 18 is a plan view showing a switch MMIC chip according to a sixth embodiment of the present invention.
Figure 19:
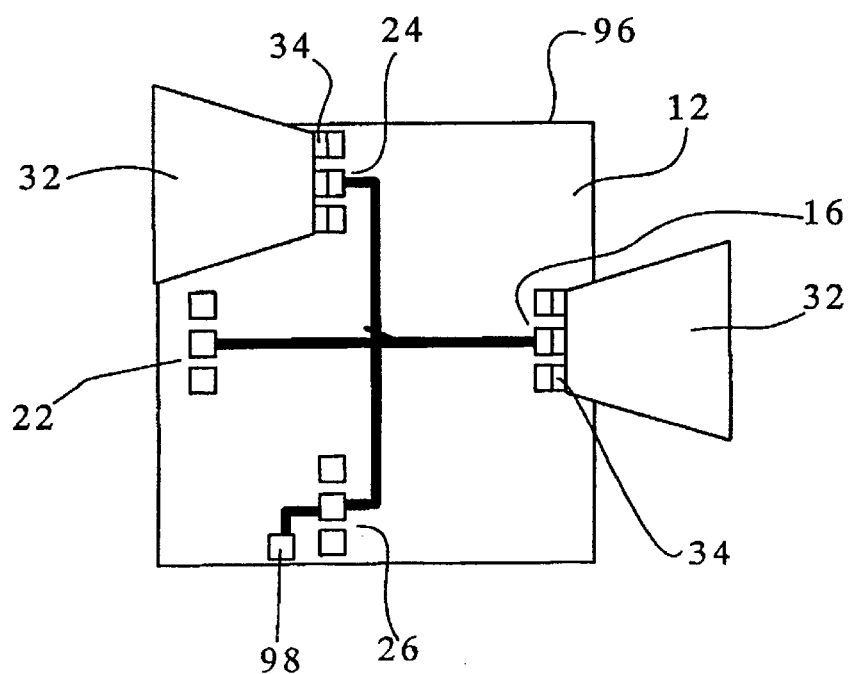
FIG. 19 is a typical view illustrating the state of measurement of a pass characteristic of the switch MMIC chip according to the sixth embodiment of the present invention.
Figure 20:
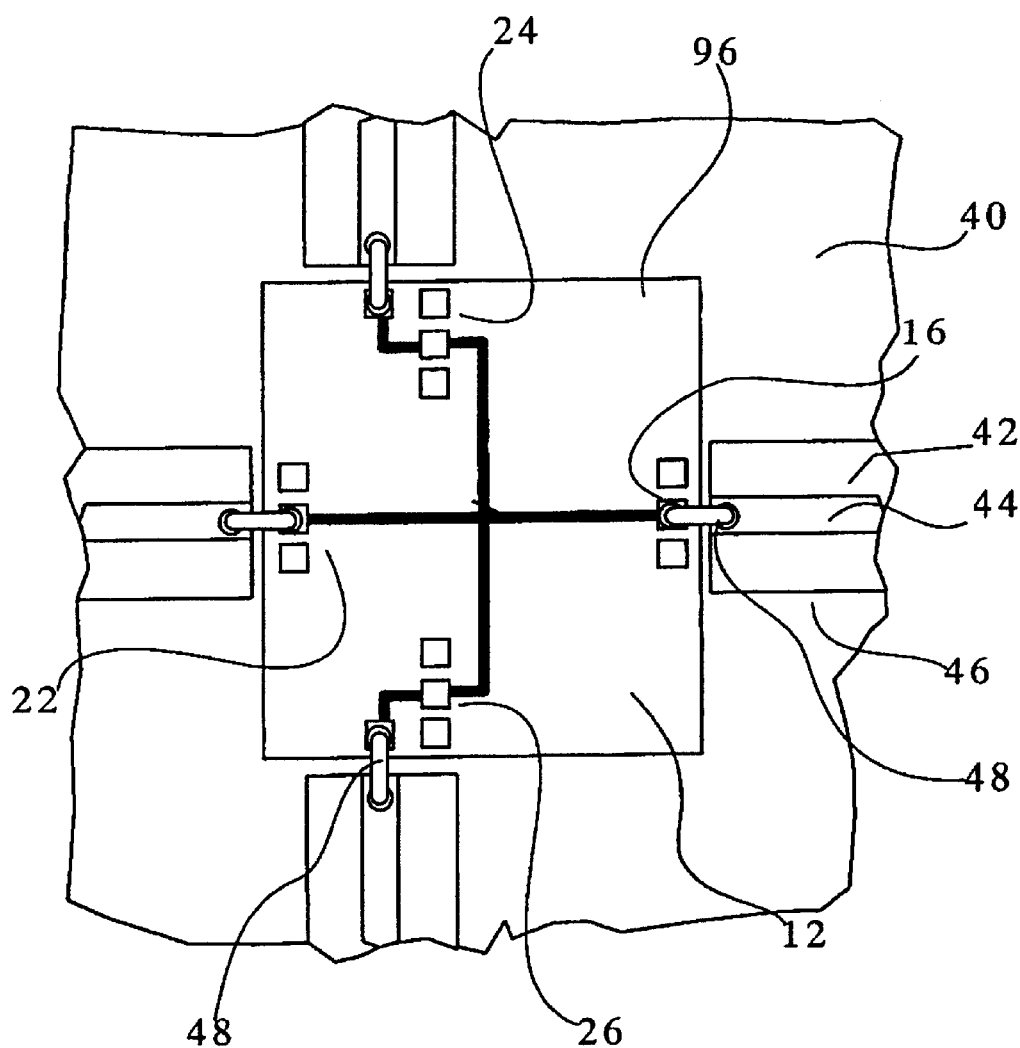
FIG. 20 is a partly plan view showing part of a module on which the switch MMIC chip according to the sixth embodiment of the present invention is implemented.

FIG. 18 is a plan view showing a switch MMIC chip according to the sixth embodiment. FIG. 19 is a typical view illustrating the state of measurement of an S parameter defined as an index of a pass characteristic of the switch MMIC chip according to the sixth embodiment. FIG. 20 is a partly plan view showing part of the interior of a high-frequency circuit device, e.g., a module on which the switch MMIC chip according to the sixth embodiment is implemented.

In FIG. 18, reference numeral 96 indicates a switch MMIC, reference numerals 98 indicate connecting pads used as second signal pads, and reference numerals 100 indicate wiring layers, respectively.

The switch MMIC 96 is one wherein in addition to the switch MMIC 10 according to the first embodiment, the connecting pads 98 are respectively disposed at positions close to their corresponding peripheral edges of a GaAs substrate 12, where they are respectively connected to the RF signal output pad 28b of the RF signal output terminal 24 and the RF signal output pad 28c of the RF signal output terminal 26 of the switch MMIC 10 through the wiring layers 100.

FIG. 19 shows the state in which an S parameter corresponding to an index indicative of a pass characteristic of a b-path is being measured. Probe heads 32 perform S-parameter measurements while probes are being brought into contact with an RF signal input terminal 16 and both an RF signal output pad 28b and grounding pads 20 of an RF signal output terminal 24 in a manner similar to the switch MMIC 10 according to the first embodiment.

In FIG. 20, reference numeral 104 indicates a module on which the switch MMIC 96 is implemented. In the module 104, bonding wires 48 connect the connecting pads 98 connected to the RF signal output pads 28b and 28c to microstrip lines 46 without connecting the microstrip lines to the RF signal output pads 28b and 28c. Since the connecting pads 98 are placed in close vicinity to the peripheral edges of the GaAs substrate 12 rather than to the RF signal output pads 28b and 28c, the bonding wires 48 can be set short and a high-frequency characteristic is improved. Further, all the bonding wires 48 can be made nearly equal to one another in length and uniform in inductance. It is thus possible to reduce variations in a high-frequency characteristic of the module.

Incidentally, the RF signal output pads 28b and 28c used for the measurement of the S parameter are different from the connecting pads 98 used to make connections to the microstrip lines 46. Thus, since an open stub is provided at the rear of a measuring end face upon on-wafer measurement, there is a difference in an on-implementation characteristic. This difference can be corrected by simulation.

Seventh Embodiment

Figure 21:
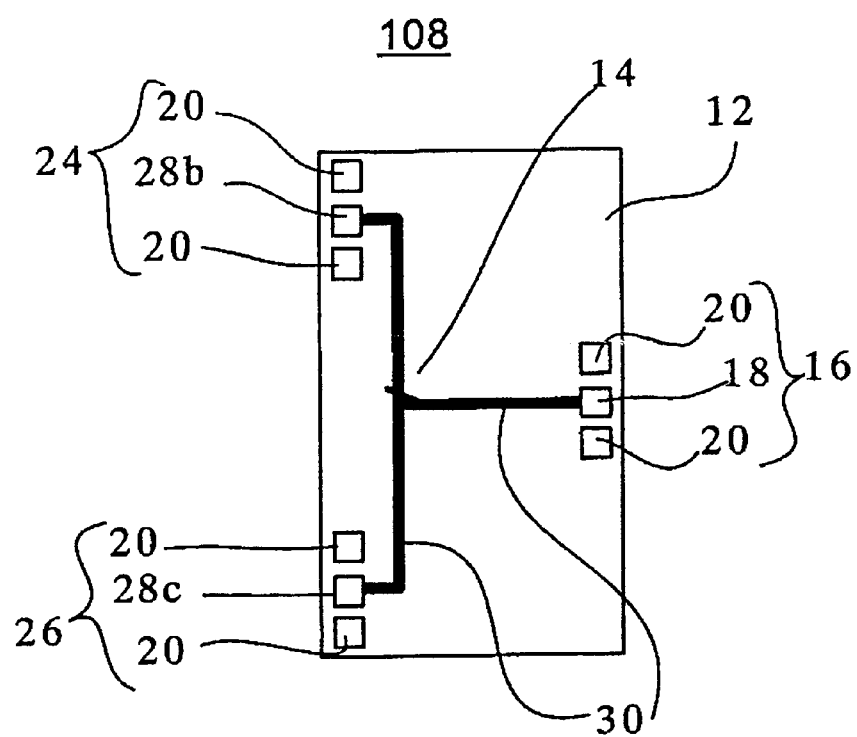
FIG. 21 is a plan view illustrating a switch MMIC chip according to a seventh embodiment of the present invention.
Figure 22:
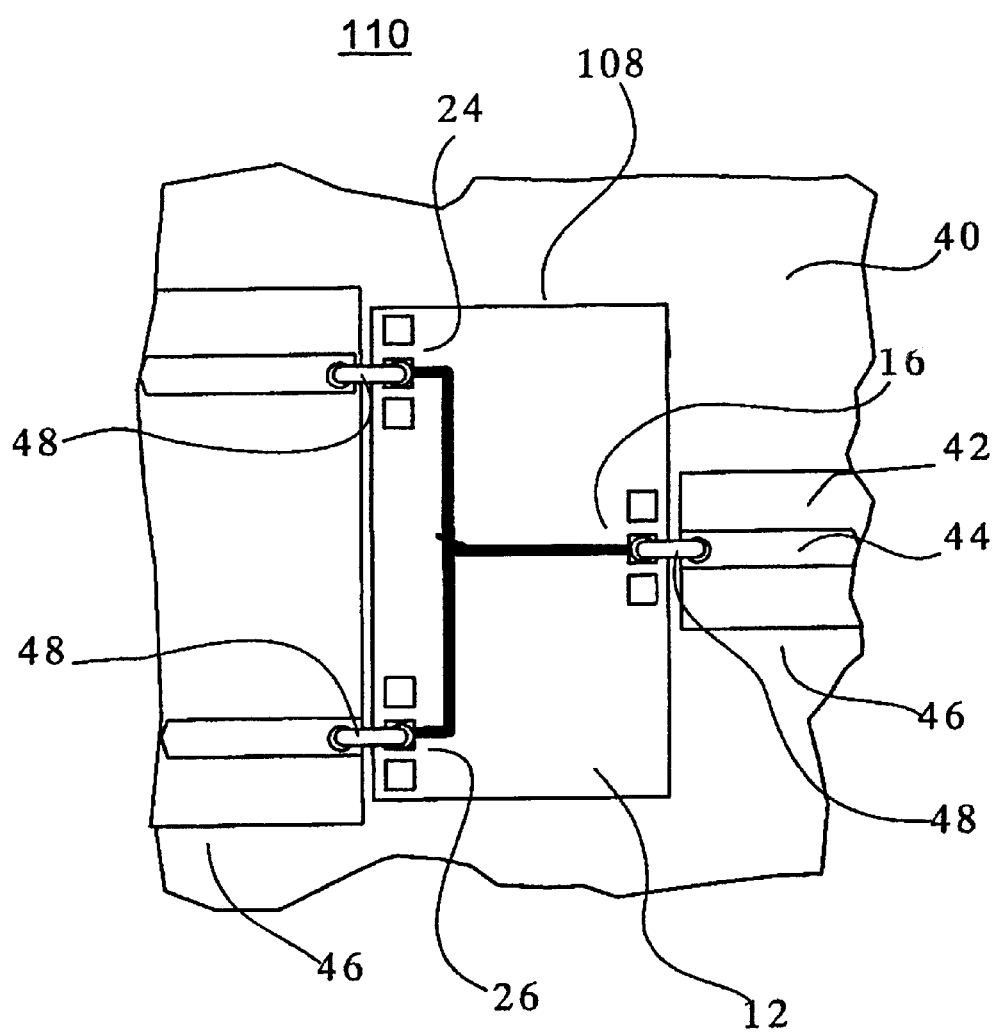
FIG. 22 is a partly plan view depicting part of a module on which the switch MMIC chip according to the seventh embodiment of the present invention is implemented.

FIG. 21 is a plan view showing a switch MMIC chip according to the seventh embodiment. FIG. 22 is a partly plan view showing part of the interior of a high-frequency circuit device, e.g., a module on which the switch MMIC chip according to the seventh embodiment is implemented.

In FIG. 21, reference numeral 108 indicates a switch MMIC. While the first through sixth embodiments have been described as the SP3T type switches MMIC, the switch MMIC 108 has an SPDT (Single Pole Double Throw) configuration. Accordingly, the switch MMIC 108 is one in which the RF signal output terminal 22 constituting the straight path has been omitted from the switch MMIC 10 according to the first embodiment.

Further, the direction in which RF signal output pads 28b and 28c of RF signal output terminals 24 and 26 and grounding pads 20 adjacent thereto are arranged, is placed in parallel to the direction in which an RF signal input pad 18 and grounding pads 20 of an RF signal input terminal are arranged.

Since the switch MMIC 108 has no RF signal output terminal 22, one peripheral edge of a GaAs substrate 12 can be formed in a straight line in parallel with the direction in which the RF signal output pads 28b and 28c of the RF signal output terminals 24 and 26 and the grounding pads 20 adjacent thereto are arranged. Therefore, the RF signal output pads 28b and 28c and the grounding pads 20 adjacent thereto can be made adjacent to the peripheral edge of the GaAs substrate 12 along the peripheral edge thereof.

Thus, S parameters can easily be measured even in the case of a b-path and a c-path each corresponding to a bend path. The present embodiment has an effect similar to the first embodiment.

In FIG. 22, reference numeral 110 indicates a module on which the MMIC 108 is implemented.

Since the RF signal output pads 28b and 28c and the grounding pads 20 adjacent thereto adjoin the peripheral edge of the GaAs substrate 12 along the peripheral edge thereof in the module 110, bonding wires 48 for respectively connecting the RF signal output pads 28b and 28c and microstrip lines 46 can be shortened. Further, all the bonding wires 48 can be made uniform in length inclusive of even a bonding wire 48 for connecting the RF signal input pad 18 and a microstrip line 46.

Thus, the module 110 can be improved in a high-frequency characteristic, and variations in a high-frequency characteristic thereof can also be reduced.

Eighth Embodiment

Figure 23:
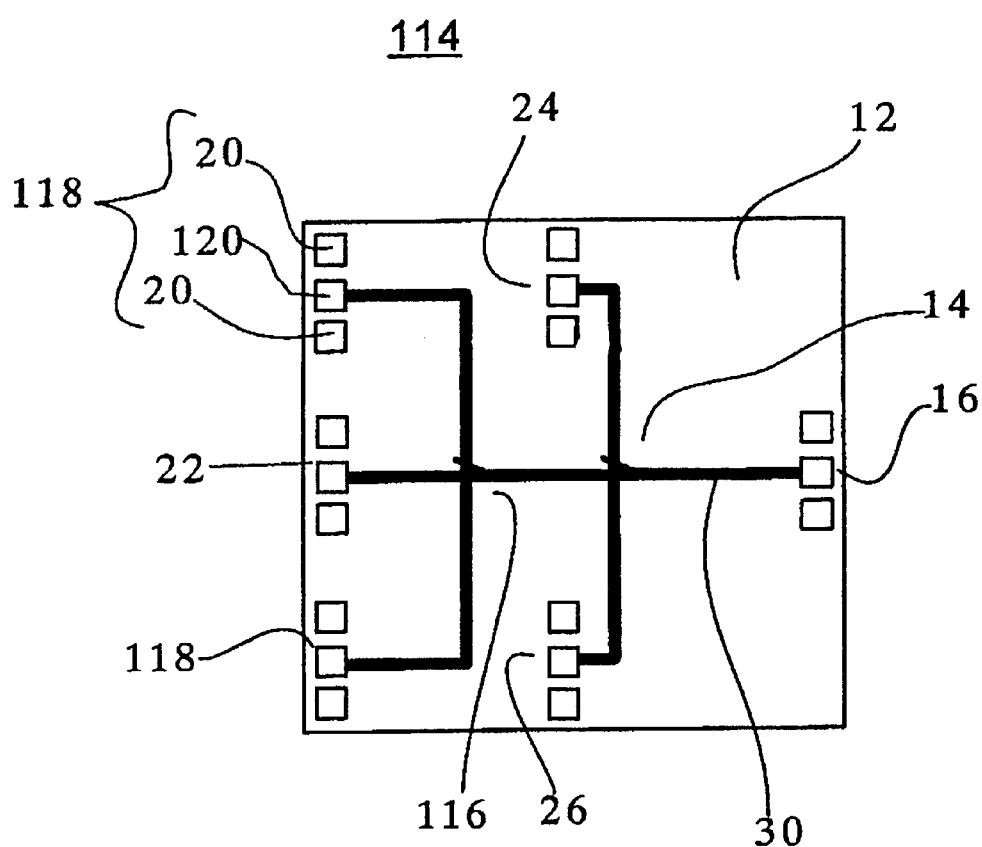
FIG. 23 is a plan view showing a switch MMIC chip according to an eighth embodiment of the present invention.

FIG. 23 is a plan view showing a switch MMIC chip according to the eighth embodiment.

In FIG. 23, reference numeral 114 indicates a switch MMIC. The switch MMIC 114 has an SP5T (Single Pole 5 Throw) configuration. Reference numeral 116 indicates a switching element used as a second circuit element. Reference numerals 118 indicate RF signal output terminals used as fourth connecting ports, and reference numerals 120 indicate RF signal output pads used as fourth signal pads, respectively.

The switch MMIC 114 is one wherein the switching element 116 directly connected to a switching element 14 is connected in addition to the switch MMIC 108 according to the seventh embodiment, an RF signal input terminal 16 and an RF signal output terminal 22 constituting a straight path are connected to the switching element 116, and the RF signal input terminal 16 and the two RF signal output terminals 118 constituting bend paths are connected thereto.

The RF signal output terminals 118 respectively have grounding pads 20, which are respectively disposed on both sides of the RF signal output pads 120 with the RF signal output pads 120 centrally interposed therebetween respectively in a manner similar to the RF signal output terminals 22, 24 and 26. Thus, the RF signal input terminals 118 also have G-S-G pad structures respectively. Further, the direction of an arrangement of the RF signal output pads 120 of the RF signal input terminals 118 and the grounding pads 20 adjacent thereto extends parallel to the direction of an arrangement of an RF signal input pad 18 and grounding pads 20 of the RF signal input terminal 16 in a manner to the RF signal output terminals 22, 24 and 26.

It is therefore unnecessary to change the orientation of each probe head on the RF signal output terminal 118 side upon the measurement of an S parameter between the RF signal input terminal 16 and each RF signal input terminal 118, which corresponds to the bend-path measurement. The S parameters can be measured by simply executing position adjustments alone.

Thus, the present switch MMIC 114 can bring about an effect similar to the switch MMIC 10 according to the first embodiment.

Further, if a circuit, which connects the switching element 14 and each of the RF signal input terminals 24 and 26, is added between the switching element 14 and the switching element 116 shown in FIG. 23, then a switch MMIC having an SPnT (Single Pole n Throw) configuration can be formed. The present switch MMIC also needs not to change the orientation of each probe head, and S parameters can be measured by simply executing position adjustments alone.

Namely, the S parameters can easily be measured and the time necessary for their working can also be shortened. Consequently, an inexpensive MMIC can be obtained.

Figure 24:
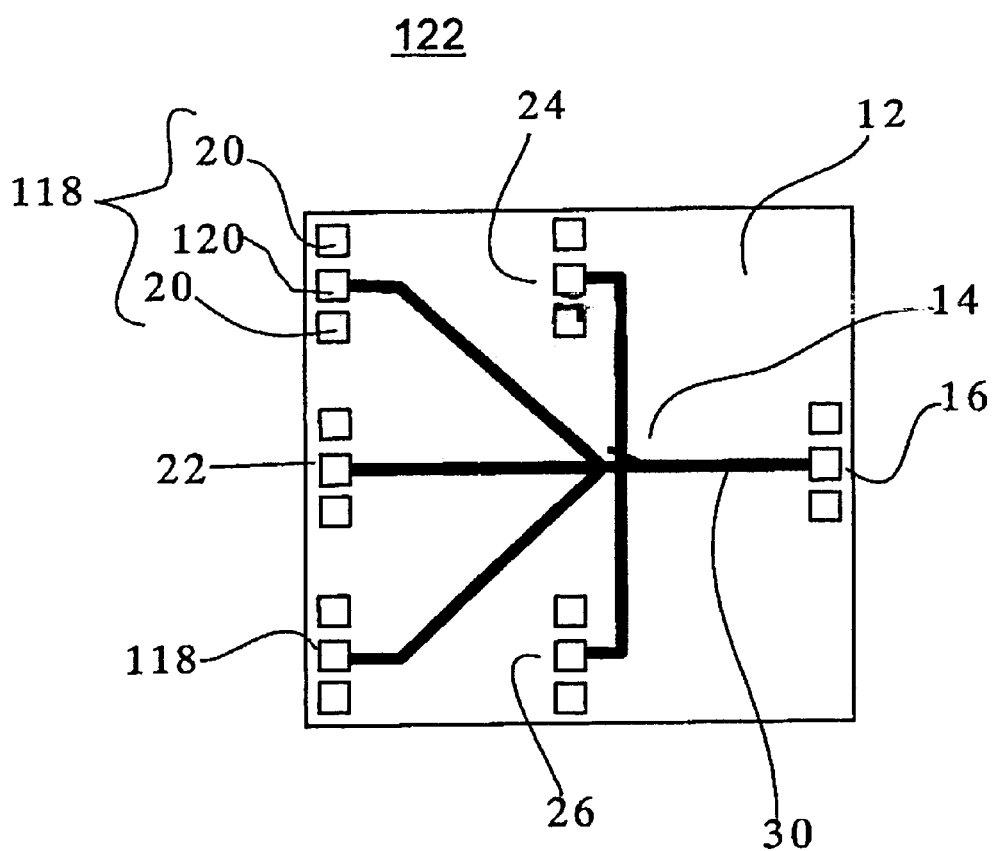
FIG. 24 is a plan view illustrating another switch MMIC chip according to the eighth embodiment of the present invention.
Figure 25:
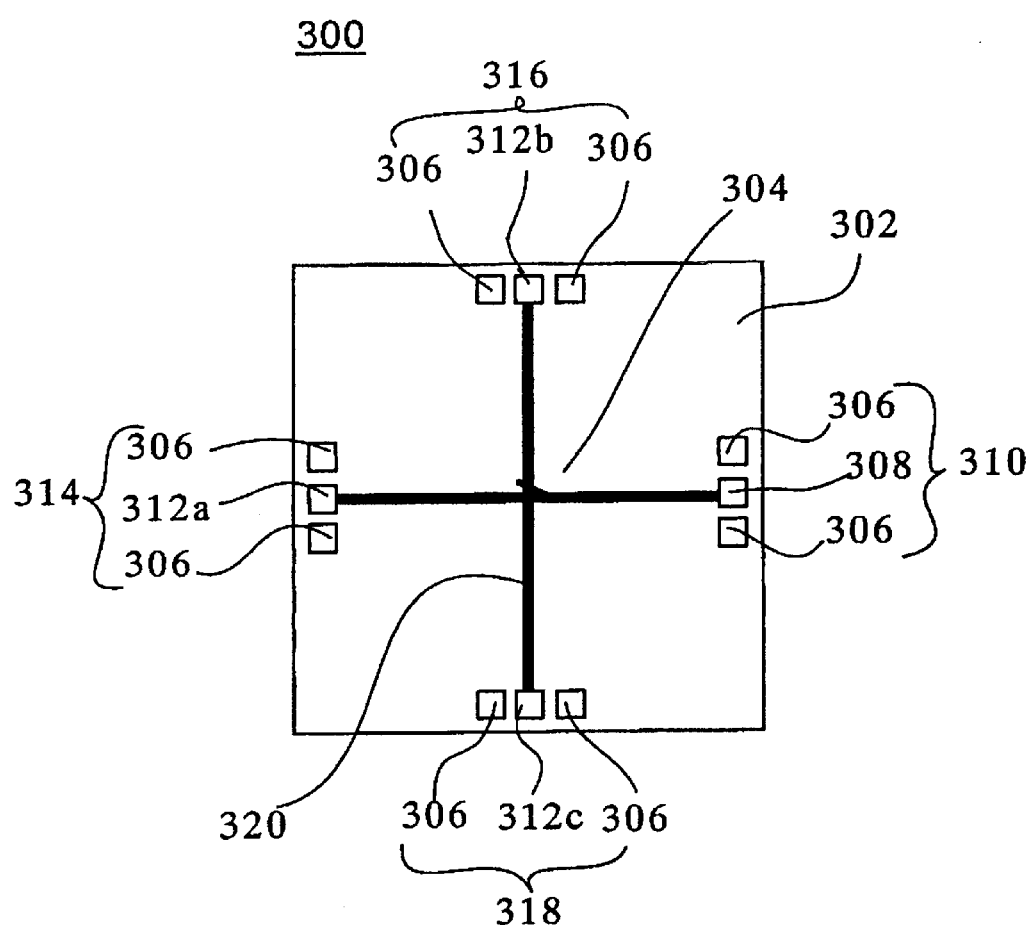
FIG. 25 is a plan view showing a conventional SP3T switch MMIC chip.
Figure 26:
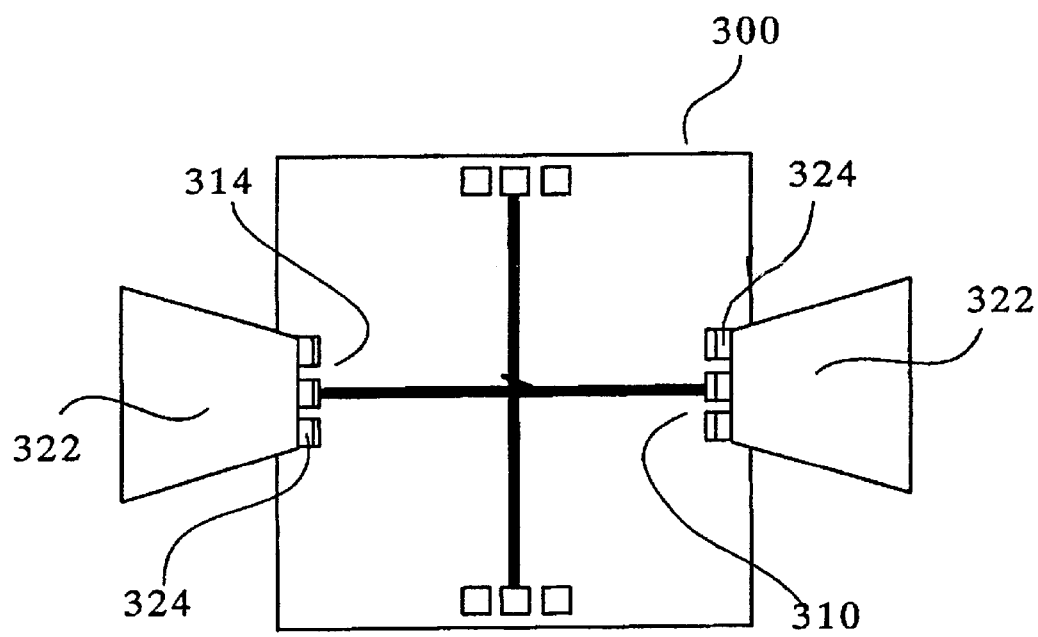
FIG. 26 is a typical view illustrating the state of measurement of a pass characteristic of the conventional SP3T switch MMIC chip.
Figure 27:
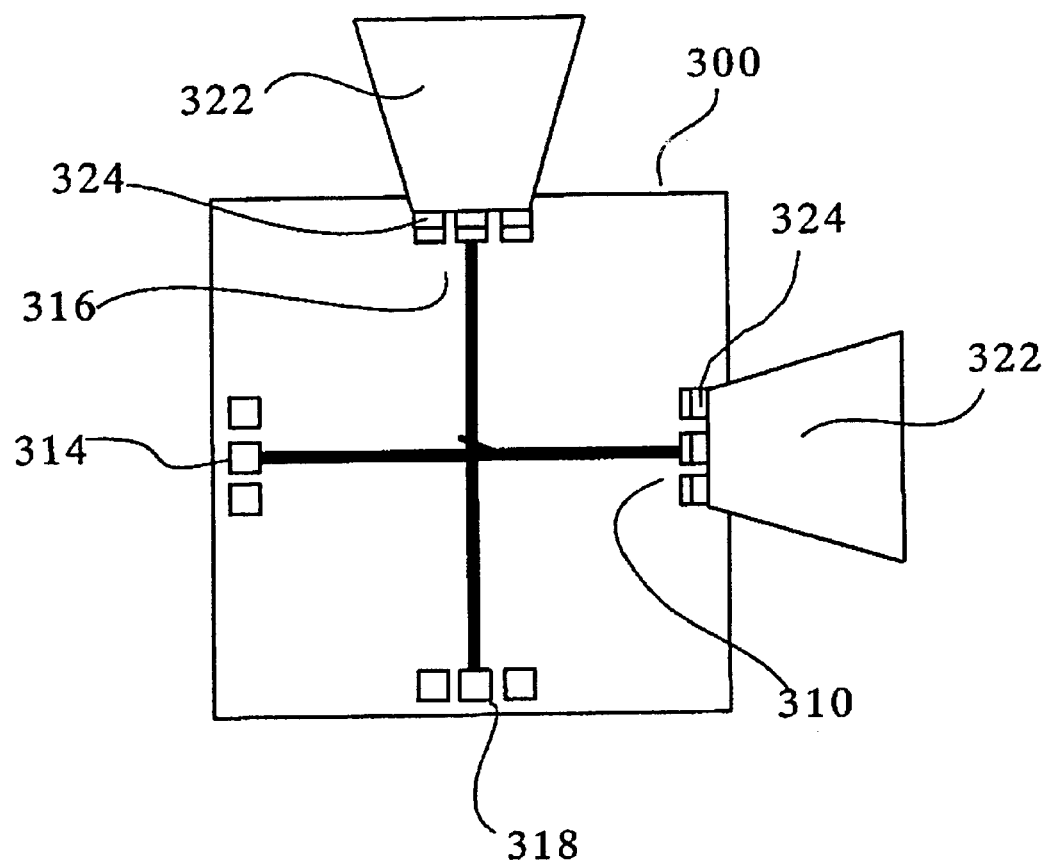
FIG. 27 is a typical view depicting the state of measurement of a pass characteristic of the conventional SP3T switch MMIC chip.
Figure 28:
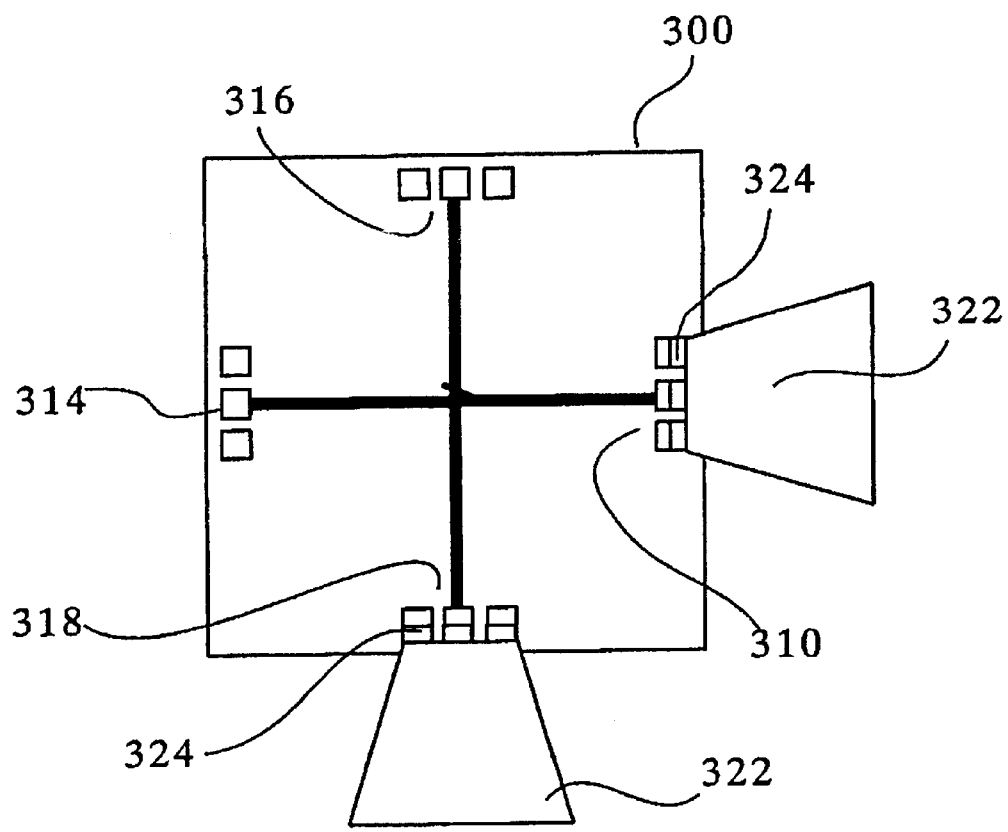
FIG. 28 is a typical view showing the state of measurement of a pass characteristic of the conventional SP3T switch MMIC chip.

FIG. 24 is a plan view showing a modification of the switch MMIC chip according to the eighth embodiment. The switch MMIC 122 is a switch MMIC having an SP5T (Single Pole 5 Throw) configuration, which is capable of being implemented by increasing the output terminals of the switching element 14. The switch MMIC 122 brings about an effect similar to the switch MMIC 114.

While the above-described embodiments have been described using the switching elements as the circuit elements, other functional circuit elements such as a mixer and a distributor may be used.

Since each embodiment has been described through the use of the switching element, one is provided as a signal input terminal, whereas the others are provided as signal output terminals. However, the present invention is not limited to it. Thus, the signal input terminal and the signal output terminals are arbitrarily set according to circuit elements.

While the flip-chip implementation has been described by the first embodiment, it is needless to say that the flip-chip implementation can be effected even on the MMIC chips illustrated in other embodiments in a manner similar to the first embodiment.

Since the integrated circuit for high-frequency use and the high-frequency circuit device according to the present invention respectively have such configurations as described above, they have the following advantageous effects.

The high-frequency integrated circuit according to the present invention comprises a semiconductor substrate, a first circuit element disposed on the semiconductor substrate and having a plurality of signal terminals, a first connecting port disposed on the semiconductor substrate and having a first signal pad connected to the first circuit element and grounding pads adjacent to the first signal pad, a second connecting port disposed on the semiconductor substrate and having a second signal pad connected to the first circuit element and grounding pads adjacent to the second signal pad in parallel with the direction of an arrangement of the first signal pad and grounding pads of the first connecting port, and a third connecting port disposed on the semiconductor substrate and having a third signal pad connected to the first circuit element and grounding pads adjacent to the third output signal pad in parallel with the direction of the arrangement of the first signal pad and grounding pads of the first connecting port. Thus, a high-frequency characteristic evaluation can be carried out with ease and high accuracy and in a short time. By extension, a high-frequency integrated circuit, which has three terminals or more, can be configured which is excellent in a high-frequency characteristic and low in cost.

Further, a fourth connecting port disposed on the semiconductor substrate and having a fourth signal pad connected to the first circuit element and grounding pads adjacent to the fourth output signal pad in parallel with the direction of the arrangement of the first signal pad and grounding pads of the first connecting port is provided. The first connecting port and the fourth connecting port are disposed so as to be opposed to each other with the first circuit element interposed therebetween. Thus, a high-frequency characteristic evaluation can be carried out with ease and high accuracy and in a short time. By extension, a high-frequency integrated circuit, which has four terminals or more inclusive of a straight path, can be configured which is excellent in a high-frequency characteristic and low in cost.

Furthermore, at least one of the second and third connecting ports has a signal pad close to the peripheral edge of the semiconductor substrate and a grounding pad disposed inside the substrate as viewed from the signal pad. Therefore, the semiconductor substrate can be reduced in area and bonding wires can be shortened upon connecting signal lines. By extension, a high-frequency integrated circuit can be configured which is small in size, excellent in a high-frequency characteristic and low in cost.

Still further, the interval between pad central-axis lines extending in the directions of arrangements of the signal pads and grounding pads of the second and third connecting ports is respectively defined as an interval exceeding at least a pad width. Since there is no mutual interference between the adjacent pads at their layout on a wafer, the semiconductor substrate can be rendered more compact. By extension, a small-sized and inexpensive high-frequency integrated circuit can be configured.

Still further, at least one of the second and third connecting ports has a grounding pad close to the peripheral edge of the semiconductor substrate and a signal pad disposed inside the substrate as viewed from the grounding pad, and has a second signal pad connected to the signal pad and disposed at a position closer to the peripheral edge of the semiconductor substrate than the signal pad. Upon the connection of signal lines, bonding wires can be shortened. By extension, a high-frequency integrated circuit can be configured which is excellent in a high-frequency characteristic and low in cost.

Still further, connecting ports respectively have signal pads close to the peripheral edges of the semiconductor substrate and grounding pads adjacent to the signal pads along the peripheral edges of the semiconductor substrate. Upon the connection of signal lines, bonding wires can be shortened. By extension, a high-frequency integrated circuit can be configured which is excellent in a high-frequency characteristic and low in cost.

Still further, a second circuit element having a plurality of signal terminals is disposed on the semiconductor substrate. A fourth connecting port directly connected to the first circuit element and having a fourth signal pad connected to the second circuit element and grounding pads adjacent to the fourth signal pad in parallel with the direction of the arrangement of the first signal pad and grounding pads of the first connecting port is further disposed on the semiconductor substrate. The number of terminals of the integrated circuit for high-frequency use can be increased as necessary with an increase in the second circuit element. By extension, a high-frequency integrated circuit can be configured which is low in cost and has a desired number of terminals. Owing to the provision of various circuit elements, a high-frequency integrated circuit having various functions can be configured.

Still further, the first circuit element is configured as a switching element, the first connecting port is configured as a signal input port, and the remaining connecting ports are configured as signal output ports. It is therefore possible to carry out a high-frequency characteristic evaluation with ease and high accuracy and in a short time. By extension, a high-frequency integrated circuit, which is excellent in a high-frequency characteristic, low in cost and has a switching function, can be configured.

The high-frequency circuit device according to the present invention comprises a conductive mounting substrate, dielectric substrates disposed on the conductive mounting substrate and having surfaces on which signal lines are disposed, a high-frequency integrated circuit disposed on the conductive mounting substrate and described in any of claims 1 to 8, and connecting conductors for respectively connecting signal pads of connecting ports of the high-frequency integrated circuit and the signal lines of the dielectric substrates. It is possible to reduce variations in electrical characteristic and enhance yields. By extension, a high-frequency circuit device low in cost and having high reliability can be configured.

Further, the back of the semiconductor substrate of the high-frequency integrated circuit is bonded to the mounting substrate with a conductive adhesive, and the connecting conductors are formed as bonding wires. Therefore, a high-frequency circuit device can be configured in a simple structure. By extension, an inexpensive high-frequency circuit device can be configured.

Furthermore, a high-frequency circuit device in which variations in a high-frequency characteristic are reduced, can be configured wherein the connecting ports of the high-frequency integrated circuit are opposed to the mounting substrate, and the high-frequency integrated circuit is disposed on the mounting substrate through the dielectric substrates. A high-frequency circuit device excellent in a high-frequency characteristic and low in cost can be configured.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-34342, filed on Feb. 9, 2001 including specification, claims, drawings and summary, on which the Convention priority of the present application is based, are incorporated herein by reference in its entirety.

What is claimed is:

1. A high-frequency integrated circuit comprising:

a semiconductor substrate;

a first circuit element disposed on said semiconductor substrate and having a plurality of signal terminals;

a first connecting port disposed on said semiconductor substrate and having a first signal pad connected to said first circuit element and grounding pads adjacent to said first signal pad, said first signal pad and grounding pads being arranged along a straight line;

a second connecting port disposed on said semiconductor substrate and having a second signal pad connected to said first circuit element and grounding pads adjacent to said second signal pad, parallel to the straight line of said first signal pad and said grounding pads of said first connecting port; and a third connecting port disposed on said semiconductor substrate and having a third signal pad connected to said first circuit element and grounding pads adjacent to said third signal pad, parallel to the straight line of said first signal pad and said grounding pads of said first connecting port.

2. The high-frequency integrated circuit according to claim 1, further comprising a fourth connecting port disposed on said semiconductor substrate and having a fourth signal pad connected to said first circuit element and grounding pads adjacent to said fourth signal pad, parallel to the straight line of said first signal pad and said grounding pads of said first connecting port, wherein said first connecting port and said fourth connecting port are opposed to each other with said first circuit element interposed between them.

3. The high-frequency integrated circuit according to claim 1, wherein at least one of said second and third connecting ports has the respective signal pad close to an edge of said semiconductor substrate and the respective grounding pad is disposed inside said substrate as viewed from the respective signal pad.

4. The high-frequency integrated circuit according to claim 3, wherein spacing between pad central-axis lines extending in directions of said signal pads and said grounding pads of said second and third connecting ports exceeds at least pad width.

5. The high-frequency integrated circuit according to claim 2, wherein at least one of said second and third connecting ports has the respective signal pad close to an edge of said semiconductor substrate and the respective grounding pad is disposed inside said substrate as viewed from the respective signal pad.

6. The high-frequency integrated circuit according to claim 5, wherein spacing between pad central-axis lines extending in directions of said signal pads and said grounding pads of said second and third connecting ports exceeds at least pad width.

7. The high-frequency integrated circuit according to claim 1, wherein at least one of said second and third -connecting ports has the respective grounding pad close to an edge of said semiconductor substrate and the respective signal pad is disposed inside said substrate as viewed from the respective grounding pad, and another signal pad is connected to the respective signal pad and is disposed closer to the edge of said semiconductor substrate than the respective signal pad.

8. The high-frequency integrated circuit according to claim 2, wherein at least one of said second and third connecting ports has the respective grounding pad close to an edge of said semiconductor substrate and the respective signal pad is disposed inside said substrate as viewed from the respective grounding pad, and another signal pad is connected to the respective signal pad and is disposed closer to the edge of said semiconductor substrate than the respective signal pad.

9. The high-frequency integrated circuit according to claim 1, wherein said first, second, and third connecting ports have their respective signal pads close to edges of said semiconductor substrate and the respective grounding pads adjacent to said signal pads along the edges of said semiconductor substrate.

10. The high frequency integrated circuit according to claim 1, including a second circuit element having a plurality of signal terminals disposed on said semiconductor substrate, and a fourth connecting port directly connected to said first circuit element and having a fourth signal pad connected to said second circuit element and grounding pads adjacent to said fourth signal pad, parallel to the straight line of said first signal pad and said grounding pads of said first connecting port.

11. The high-frequency integrated circuit according to claim 1, wherein said first circuit element is a switching element, said first connecting port is a signal input port, and the remaining connecting ports are signal output ports.

12. A high-frequency circuit device comprising:

a conductive mounting substrate;

dielectric substrates disposed on said conductive mounting substrate and having surfaces on which signal lines are disposed;

a high-frequency integrated circuit disposed on said conductive mounting substrate and comprising a semiconductor substrate, a first circuit element disposed on said semiconductor substrate and having a plurality of signal terminals, a first connecting port disposed on said semiconductor substrate and having a first signal pad connected to said first circuit element and grounding pads adjacent to said first signal pad, said first signal pad and said ground pads being arranged along a straight line, a second connecting port disposed on said semiconductor substrate and having a second signal pad connected to said first circuit element and grounding pads adjacent to said second signal pad, parallel to the straight line of said first signal pad and said grounding pads of said first connecting port, and a third connecting port disposed on said semiconductor substrate and having a third signal pad connected to said first circuit element and grounding pads adjacent to said third signal pad, parallel to the straight line of said first signal pad and said grounding pads of said first connecting port; and connecting conductors respectively connecting the respective signal pads of said connecting ports of said high-frequency integrated circuit and said signal lines of said dielectric substrates.

13. The high-frequency circuit device according to claim 12, wherein said semiconductor substrate is bonded to said mounting substrate with a conductive adhesive, and said connecting conductors are bonding wires.

14. The high-frequency circuit device according to claim 12, wherein said connecting ports of said high-frequency integrated circuit are opposed to said mounting substrate, and said high-frequency integrated circuit is disposed on said mounting substrate through said dielectric substrates.

* * * * *